(12) United States Patent
Aldajani et al.

(10) Patent No.: US 7,391,350 B2
(45) Date of Patent: Jun. 24, 2008

(54) ADAPTIVE MULTI-BIT DELTA AND SIGMA-DELTA MODULATION

(75) Inventors: Mansour A. Aldajani, Dhahran (SA); Ali H. Sayed, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/529,712

(22) PCT Filed: Oct. 15, 2003

(86) PCT No.: PCT/US03/32835

§ 371 (c)(1),
(2), (4) Date: Mar. 29, 2005

(87) PCT Pub. No.: WO2004/036754

PCT Pub. Date: Apr. 29, 2004

(65) Prior Publication Data

US 2006/0055482 A1    Mar. 16, 2006

Related U.S. Application Data

(63) Continuation-in-part of application No. 10/332,750, filed on Jan. 13, 2003, now Pat. No. 7,073,113, application No. 10/529,712, which is a continuation-in-part of application No. 10/256,606, filed on Sep. 27, 2002.

(60) Provisional application No. 60/418,644, filed on Oct. 15, 2002, provisional application No. 60/325,350, filed on Sep. 27, 2001, provisional application No. 60/218,103, filed on Jul. 13, 2000.

(51) Int. Cl.
*H03M 3/00* (2006.01)
(52) U.S. Cl. ........................................ 341/143; 341/155
(58) Field of Classification Search ................. 341/143, 341/155, 156
See application file for complete search history.

(56) References Cited

U.S. PATENT DOCUMENTS

| 5,204,878 | A |   | 4/1993 | Larsson |
|-----------|---|---|--------|---------|
| 5,313,495 | A |   | 5/1994 | Kim |
| 5,331,111 | A |   | 7/1994 | O'Connell |
| 5,528,240 | A | * | 6/1996 | Wilson et al. ............... 341/143 |
| 5,625,358 | A | * | 4/1997 | Wilson et al. ............... 341/143 |
| 6,011,956 | A |   | 1/2000 | Yamano et al. |

(Continued)

FOREIGN PATENT DOCUMENTS

JP        06219530        9/1994

OTHER PUBLICATIONS

Mansour et al., "Stability and Performance Analysis of an adaptive Sigma-Delta Modulator", IEEE Transactions on CIrcuits and Systems- II ANalog and DIgital Signal Processing, vol. 48, No. 3 Mar. 2001, pp. 233-244.*

(Continued)

*Primary Examiner*—Jean B Jeanglaude
(74) *Attorney, Agent, or Firm*—Gates & Cooper LLP

(57) ABSTRACT

An adaptive multi-bit delta and sigma-delta modulation and demodulation technique, wherein a one-bit modulator generates a binary output signal from an analog input signal and a multi-bit adapter for generating a scaling signal for scaling a step-size of the sigma-delta modulator.

14 Claims, 22 Drawing Sheets

U.S. PATENT DOCUMENTS

| | | | |
|---|---|---|---|
| 6,034,952 | A | 3/2000 | Dohi et al. |
| 6,323,794 | B1 * | 11/2001 | Okuda et al. ............... 341/143 |
| 6,339,621 | B1 | 1/2002 | Cojocaru et al. |
| 6,463,295 | B1 | 10/2002 | Yun |
| 6,489,913 | B1 * | 12/2002 | Hansen et al. ............. 341/156 |

OTHER PUBLICATIONS

Jaggi et al., "Instantaneous Adaptive Delta sigma Modulator", Can. Electri. Eng. J., vol. 1, pp. 3-6, Jan. 1986.*

T. Ojanpera et al., Wideband CDMA for Third Generation Mobile Communications, Artech House, London, 1998, pp. Table of contents, 47-48, 58-62, 153-156 and 208-218.

W. Xinyu, et al., "Adaptive power control on the reverse link for CDMA cellular system," Proc. of APCC/OECC'99—5th Asia Pacific Conference on Communications/4th Optoelectronics and Communications Conference, Beijing China, Oct. 1999, vol. 1, pp. 608-611.

S. Nourizadeh, et al., "A Novel Closed Loop Power Control for UMTS," First International Conference on 3G Mobile Communication Technologies, London, UK, Mar. 2000, pp. 56-59.

S. Park et al., "DS/CDMA closed-loop power control with adaptive algorithm," Electronics Letters, IEE, Aug. 19, 1999, vol. 35, No. 17, pp. 1425-1427.

M. Sim, et al., "Performance study of close-loop power control algorithms for a cellular CDMA system," IEEE Transactions on Vehicular Technology, IEEE, May 1999, vol. 48, No. 3, pp. 911-921.

H. Su et al., "Adaptive closed-loop power control with quantized feedback and loop filtering," 1998, IEEE, vol. 2, pp. 926-931.

S. Choe, et al., "Linear prediction at base station for closed loop power control," IEEE 49th Vehicular Technology Conference, Houston, TX, USA, May 1999, vol. 2, pp. 1469-1473.

J. Tanskanen, et al., "Predictive power estimators in CDMA closed loop power control," 48th IEEE Vehicular Technology Conference, Ottawa, Ont., Canada, May 18-21, 1998, IEEE, vol. 2, pp. 1091-1095.

A. Abrardo et al., "On the analytical evaluation of closed-loop power-control error statistics in DS-CDMA cellular systems," IEEE Trans. Vehic. Tech., vol. 49, No. 6, pp. 2071-2080, Nov. 2000.

F. Lau et al., "Intelligent closed-loop power control algorithm in CDMA mobile radio system," Electronics Letters, vol. 35, No. 10, pp. 785-786, May 1999.

M. Aldajani et al., "A stable adaptive structure for delta modulation with improved performance," Proc. International Conference on Acoustics, Speech and Signal Processing Proceedings, vol. IV or VI, Salt Lake City, Utah, pp. 2621-2624, May 2001.

M. Aldajani et al., "Stability and performance analysis of an adaptive sigma delta modulator," IEEE Trans. Circuits and Systems II, vol. 48, No. 3, pp. 233-244, Mar. 2001.

C.C. Lee et al., "Closed-loop power control in CDMA systems," IEE Proceedings- Communications, vol. 143, No. 4, pp. 231-239, Aug. 1996.

V. Garg et al., "Principles and Applications of GSM," Prentice Hall, NJ, 1999, Front Cover, Copyright page, Table of Contents and pp. 93-96.

M. Aldajani et al., "An Adaptive Structure for Sigma Delta Modulation with Improved Dynamic Range," Proceedings of the 43rd IEEE Midwest Symposium on Circuits and Systems, vol. 1, Aug. 8-11, 2000, pp. 390-394.

J. Yu et al., "Adaptive Quantisation for One-Bit Sigma-Delta Modulation," IEE Proceedings-G, vol. 139, No. 1, Feb. 1992, pp. 39-44.

C. Chakravarthy, "An Amplitude-Controlled Adaptive Delta Sigma Modulator," The Radio and Electronic Engineer, vol. 49, No. 1, Jan. 1979, pp. 49-54.

M. Jaggi, "Instantaneously Adaptive Delta Sigma Modulator," Can. Elect. Eng. J., vol. 11, No. 1, 1986, pp. 3-6.

C. Dunn et al., "Fixed and Adaptive Sigma-Delta Modulators with Multibit Quantisers," Applied Sig. Process., 3:212-222, 1996, pp. 212-222.

M.A. Aldajani et al., "An Adaptive Structure for Sigma Delta Modulation with Improved Dynamic Range," XP-002245293, Proc. 43rd IEEE, pp. 390-394.

C.V. Chakravarthy, "An amplitude-controlled adaptive delta sigma modulator," The Radio and Electronic Engineer 49(1), 49-54, Jan. 1979.

C. Dunn et al., "Fixed and Adaptive Sigma-Delta Modulators with Multibit Quantisers," Applied Sig Process 3:212-222, 1996.

M.P. Jaggi et al., "Instantaneously adaptive delta sigma modulator," Can. Elec. Eng. J. 11(1) 1986.

J. Yu et al., "Adaptive quantisation for one-bit sigma-delta modulation," IEE Proceedings-G 139(1), Feb. 1992.

* cited by examiner

ADAPTIVE MULTI-BIT DELTA AND SIGMA-DELTA MODULATION

CROSS-REFERENCE TO RELATED APPLICATIONS

This application claims priority under 35 U.S.C. §119(e) to U.S. Provisional Patent Application No. 60/418,644, filed Oct. 15, 2002, by Ali H. Sayed and Mansour A. Aldajani, entitled "ADAPTIVE MULTI-BIT DELTA AND SIGMA-DELTA MODULATION," which application is incorporated by reference herein.

This application is a continuation-in-part of and commonly-assigned U.S. patent application Ser. No. 10/332,750, filed on Jan. 13, 2003, by Mansour A. Aldajani and Ali H. Sayed, entitled "ADAPTIVE SIGMA-DELTA MODULATION WITH IMPROVED DYNAMIC RANGE," now U.S. Pat. No. 7,073,113, issued Jul. 4, 2006, which application claims priority to co-pending and commonly-assigned International Application No. PCT/US01/22193, filed on Jul. 13, 2001, by Mansour A. Aldajani and Ali H. Sayed, entitled "ADAPTIVE SIGMA-DELTA MODULATION WITH IMPROVED DYNAMIC RANGE," which application claims priority to co-pending and commonly-assigned U.S. Provisional Patent Application Ser. No. 60/218,103, filed on Jul. 13, 2000, by Mansour A. Aldajani and Ali H. Sayed, entitled "STRUCTURE FOR ADAPTIVE SIGMA-DELTA MODULATION WITH IMPROVED DYNAMIC RANGE," all of which applications are incorporated by reference herein.

This application is a continuation-in-part of co-pending and commonly-assigned U.S. patent application Ser. No. 10/256,606, entitled "CLOSED LOOP POWER CONTROL TECHNIQUES," filed on Sep. 27, 2002, by Mansour A. Aldajani and Ali H. Sayed, which application claims the benefit under 35 U.S.C. §119(e) of the following co-pending and commonly-assigned U.S. Provisional Patent Application Ser. No. 60/325,350, entitled "CLOSED LOOP POWER CONTROL TECHNIQUES IN WIRELESS SYSTEMS," filed on Sep. 27, 2001, by Mansour A. Aldajani and Ali H. Sayed, both of which applications are incorporated by reference herein.

BACKGROUND OF THE INVENTION

1. Field of the Invention

The present invention relates to analog-to-digital converters, and in particular, to a structure for adaptive multi-bit delta and sigma-delta modulation.

2. Description of the Related Art (Note: This application references a number of different publications as indicated throughout the specification by reference numbers enclosed in brackets, e.g., [x]. A list of these different publications ordered according to these reference numbers can be found below in the Section entitled "Publications" in the Detailed Description of the Preferred Embodiment. Each of these publications is incorporated by reference herein.)

The signal-to-noise (SNR) performance of the source coder varies with the strength of the input signal. In pulse code modulation (PCM), for example, the SNR is proportional to the ratio $V/\sigma_x$ where V is the full scale amplitude of the coder and $\sigma_x$ is the standard deviation of the input signal. Waveform coders are also expected to have good dynamic range performance, i.e., to have high SNR even for small input strength. It is well-known that log-PCM (e.g., µ-law and A-law PCM) improves the dynamic range of the coder by reducing, but not eliminating, the dependence of SNR on the ratio $V/\sigma_x$. Another method to increase the dynamic range of coders is to use adaptive delta modulation (ADM) and adaptive sigma-delta modulation (ASDM) systems. See, for example [1]-[6] for overviews on data converters and their applications. Still, conventional ADM and ASDM systems tend to be one-bit coders and their performance is therefore limited by this fact.

In previous works [7, 8], two adaptive delta and sigma-delta modulation schemes have been proposed. While these schemes still employ single-bit quantization, they were nevertheless shown to exhibit superior tracking performance, high dynamic range and improved SNR compared to other similar schemes. Of course, one way to further improve their performance would be to increase the number of quantization bits.

Doing so will decrease quantization noise and increase the overall SNR. However, in the process of this modification it is useful to make a distinction between quantization bits inside a main loop of a modulator and quantization bits inside an adapter that is used to adapt the step-size of the modulator. The present invention maintains the quantization within the main loop to one bit, but increases the quantization within the adapter to multiple bits in a manner that results in improved performance.

Specifically, the present invention describes adapters using multi-bit modulation, including a companded differential pulse code modulator, an adaptive sigma-delta modulator, an adaptive delta modulator, and adaptive differential pulse code modulation. The present invention also describes a framework for studying the performance of these adapters by showing how they can modeled in terms of first-order random gain models. Performance measures are derived from these simplified models and simulation results are then used to illustrate a good match between theory and practice.

SUMMARY OF THE INVENTION

To overcome the limitations in the prior art described above, and to overcome other limitations that will become apparent upon reading and understanding the present specification, the present invention discloses an adaptive multi-bit delta and sigma-delta modulation and demodulation technique, wherein a one-bit modulator generates a binary output signal from an analog input signal and a multi-bit adapter generates a signal for scaling a step-size of the modulator.

BRIEF DESCRIPTION OF THE DRAWINGS

Referring now to the drawings in which like reference numbers represent corresponding parts throughout.

DETAILED DESCRIPTION OF PREFERRED EMBODIMENT

In the following description, reference is made to the accompanying drawings which form a part hereof, and which show, by way of illustration, a preferred embodiment of the present invention. It is understood that other embodiments may be utilized and structural changes may be made without departing from the scope of the present invention.

1 Overview

The present invention discloses adaptive delta and sigma-delta modulation structures using a single quantization bit inside a main loop of a modulator and multiple quantization bits inside an adapter that is used to adapt the step-size of the modulator. Four structures where the adapter is implemented are described, including: (1) a companded differential pulse code modulator, (2) an adaptive sigma-delta modulator, and (3) an adaptive delta modulator, (4) an adaptive differential pulse code modulator (ADPCM). The present invention also describes a framework for studying the performance of the proposed adapter structures in terms of first-order random gain models, and show that the proposed adapter structures result in improved SNR, tracking, and high dynamic range.

2 Companded Differential Pulse Code Modulator (DPCM)

Figure 1A:
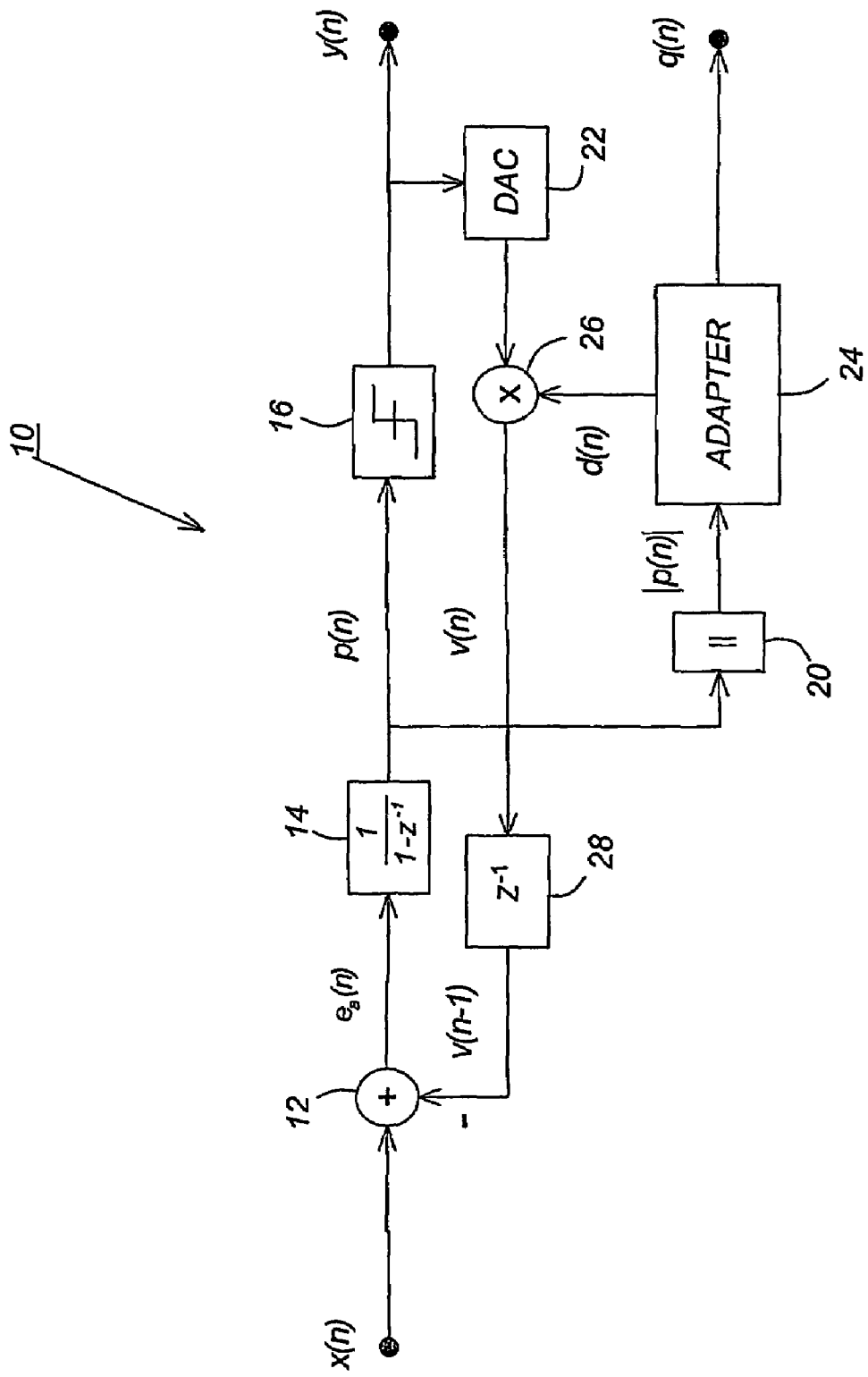
FIG. 1A illustrates a structure for adaptive sigma delta modulation and FIG. 1B illustrates a structure for adaptive sigma delta demodulation.

FIG. 1A illustrates the structure of a sigma-delta modulator 10 first proposed in [7], wherein the modulator 10 is comprised mainly of two parts: a conventional sigma-delta modulation part, and a step-size adaptation part.

The sigma-delta modulation part includes a summing junction 12, integrator 14 and one-bit quantizer 16, wherein the difference between a sampled analog input signal x(n) and an output signal p(n) from the integrater 14 is converted into a binary output signal y(n) having a specified number of bits at the quantizer 16. The binary output signal y(n) is a representation of the analog input signal x(n) contaminated with noise created by the quantizer 16.

The step-size adaptation part includes an absolute value block 20, digital-to-analog converter (DAC) 22, adapter 24, multiplier 26 and delay 28, wherein the step-size of the quantizer 16 is adapted based on estimates of absolute value of the signal p(n), where p(n) is the input to the quantizer 16. The absolute value block 20 generates the absolute value signal |p(n)| to the quantizer 16. The DAC 22 converts the output y(n) from the quantizer 16. The adapter 24 uses the absolute value signal |p(n)| output from the absolute value block 20 to produce a scaling signal d(n), which is an approximation of the absolute value signal |p(n)|, and a binary sequence signal q(n) from which the signal d(n) can be re-generated. The scaling signal d(n) is multiplied by the multiplier 26 using the output y(n) from the DAC 20 to create an encoded signal v(n):

$$v(n)=y(n)d(n)$$

The encoded signal v(n) is delayed at the delay 28 and the delayed signal v(n−1) is subtracted from the analog input signal x(n) at the summing junction 12 to generate an error signal $e_a(n)$:

$$e_a(n)=x(n)-v(n-1)$$

The error signal $e_a(n)$ is then passed through the integrator 14, and the signal p(n) is output from the integrator 14. The signal p(n) is quantized by the quantizer 16 to produce the binary output signal y(n).

Figure 1B:
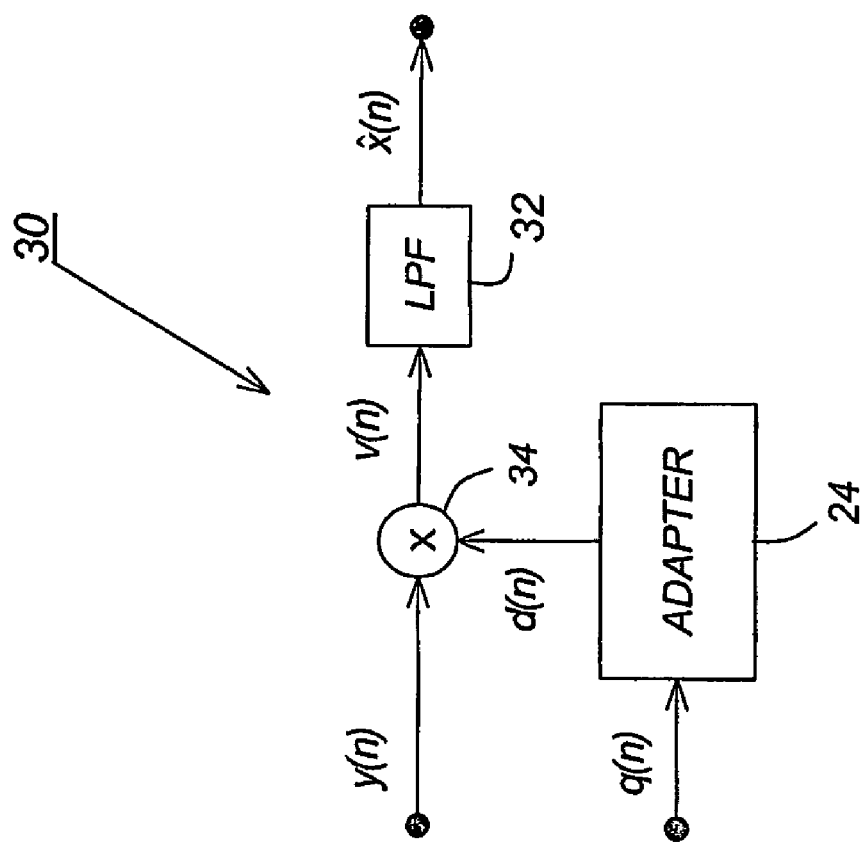

FIG. 1B illustrates the structure of a sigma-delta demodulator 30, wherein the demodulator 30 is also comprised mainly of two parts: a sigma-delta demodulation part, and a step-size adaptation part. The sigma-delta demodulation part is similar in function to the sigma-delta modulation described in conjunction with FIG. 1A, and includes a low pass filter 32 that filters out a shaped quantization signal from the binary output signal y(n), thereby resulting in an approximation ($\hat{x}(n)$) of the original analog input signal x(n). Similar to the modulator 10, the step-size adaptation part includes a multiplier 34 and adapter 24, wherein the adapter 24 accepts the signal q(n) from the modulator 10 and generates the scaling signal d(n) to vary the step-size of the demodulater 30.

The key difference in relation to other sigma-delta modulators is in the manner by which the adapter 24 functions. The functionality of the adapter 24 is illustrated in FIG. 2.

The adapter 24 includes a summing junction 12, one-bit quantizer 16, integrator 14, delay 28 and exponential term block 36. A delayed scaling signal d(n−1) is subtracted from the absolute value of the signal p(n) at summing junction 12, and the results therefrom are quantized by the quantized 16. The binary sequence signal q(n), from which the signal d(n) can be re-generated, is output by the quantizer 16 to the integrater 14, which generates the signal w(n) as an input to the exponential term block 36. The exponential term block 36 outputs the scaling signal d(n), which is output from the adapter 24, and also input to the delay 28 to create the delayed scaling signal d(n−1).

The purpose of the adapter 24 is to adapt the step-size of the quantizer 16 and, as can be seen from the figure, the adapter 24 functions as a delta modulator in its own right with an additional exponential term block 36. The purpose of this additional exponential term block 36 is to boost up the tracking performance of the adapter 24. This adapter 24 differs from other adaptation schemes (e.g., [9]-[11]) in that it uses the input signal |p(n)| rather than the original input signal x(n) itself. The result is an increase in both SNR and dynamic range in comparison to conventional SDMs. In particular, the analysis in [7] showed that the SNR of the system is independent of the input strength.

Figure 2:
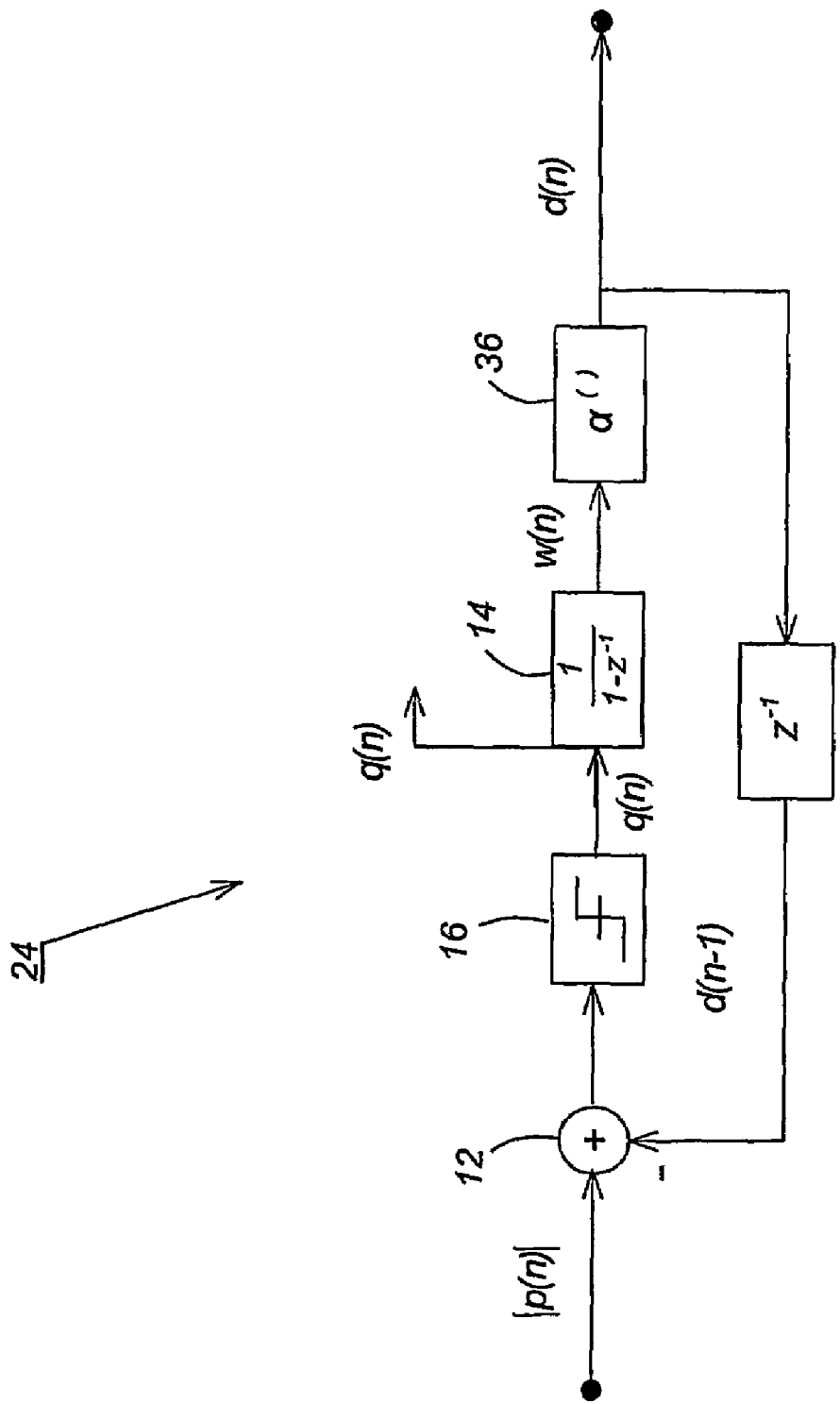
FIG. 2 illustrates a structure of the adapter used for adapting the quantizer step-size.
Figure 3:
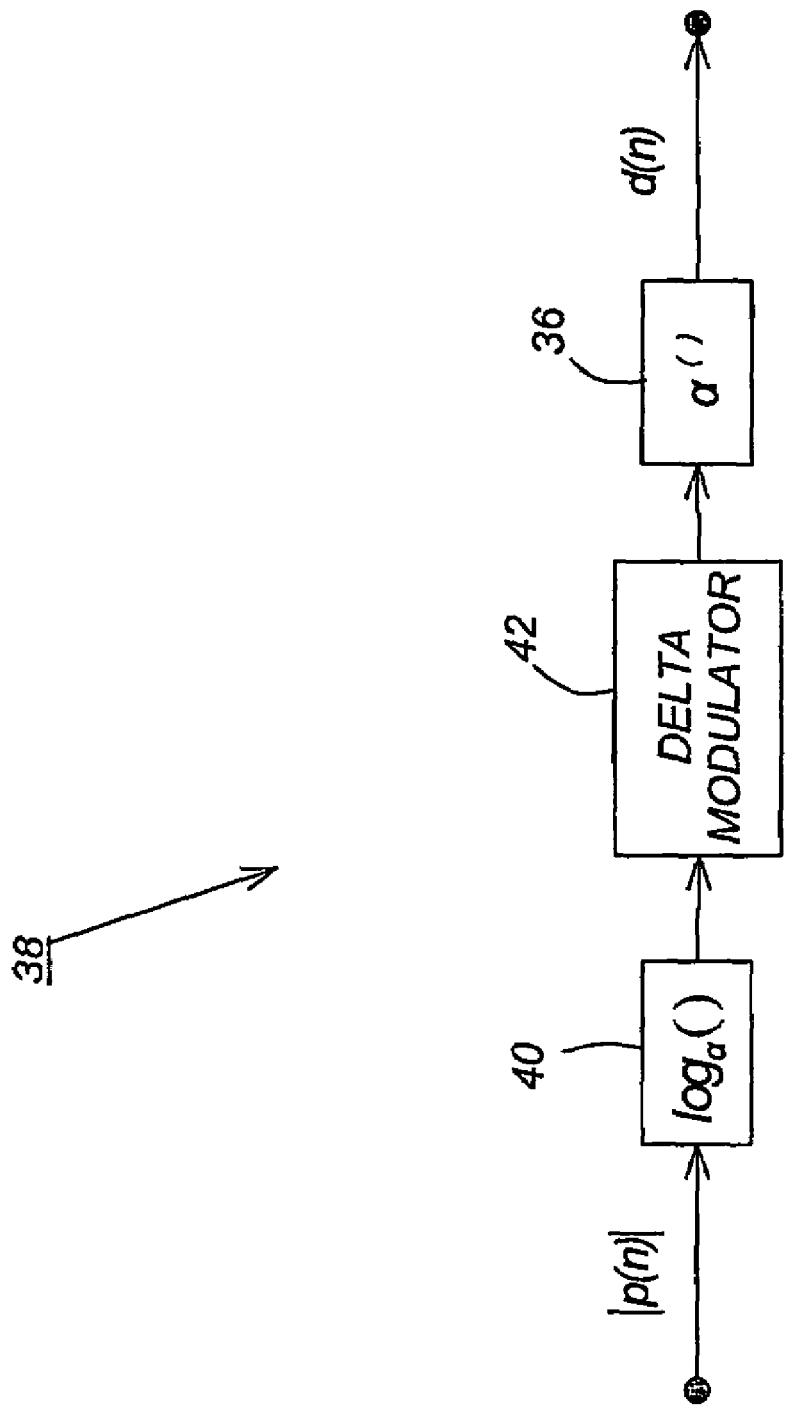
FIG. 3 illustrates an equivalent structure of the adapter in terms of a companded delta modulator.

Actually, the analysis in [7] further showed that the adapter 24 of FIG. 2 could be redrawn in an equivalent form as a companded delta modulator 38, as shown in FIG. 3. The companded delta modulator 38 includes a logarithm term block 40, delta modulator (DM) 42 and exponential term block 36, wherein the input signal to the companded delta modulator 38 is |p(n)| and the output signal from the companded delta modulator 38 is d(n). The mapping from |p(n)| to d(n) undergoes companding at 40 and expansion at 36 in addition to delta modulation at 38. This equivalent structure is very useful, since it suggests a way to extend the desirable properties of the single-bit ASDM of [7] to the multi-bit scenario.

Figure 4:
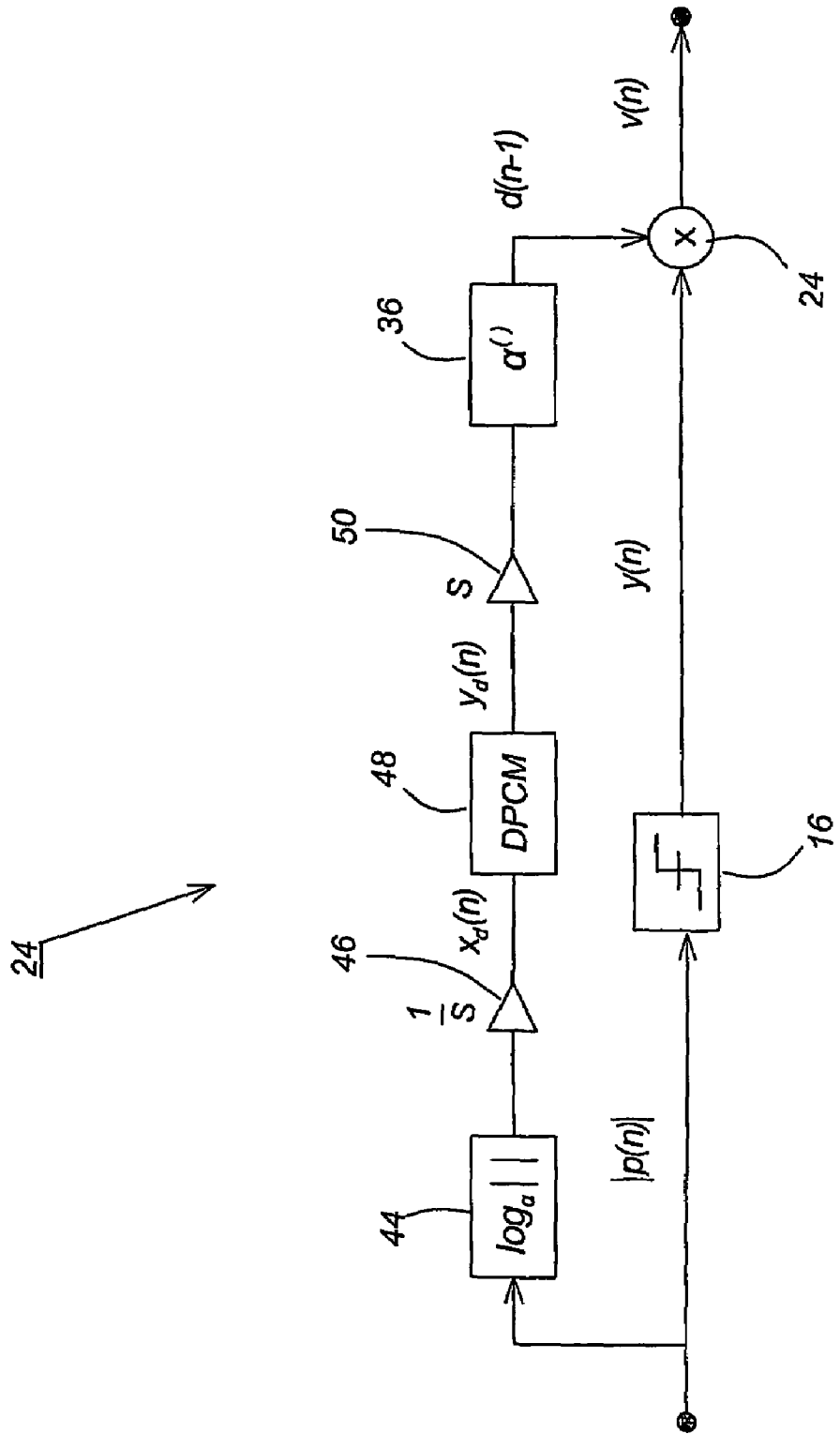
FIG. 4 illustrates an adapter with a companded differential pulse-coded modulater (DPCM) structure.

First, the DM 42 inside the adapter 24 may be replaced by a more generic differential pulse code modulator (DPCM) as shown in FIG. 4. The adapter 24 of FIG. 4 includes a logarithm term block 44 for companding the signal |p(n)| to recreate an analog signal $x_d(n)$, an op-amp 46 for adjusting the signal $x_d(n)$ by a scaling factor 1/S, a DPCM 48 for differentially pulse code modulating the adjusted $x_d(n)$ to generate a binary output signal $y_d(n)$, an op-amp 50 for adjusting the binary output signal $y_d(n)$ by a scaling factor S, and an exponential term block 36 for expanding the adjusted $y_d(n)$ to generate a delayed scaling factor d(n−1). In parallel, the signal |p(n)| is quantized by a one-bit quantizer 16 to generate a binary output signal y(n), wherein y(n) is multiplied at multiplier 26 by the delayed scaling factor d(n−1) to generate a encoded signal v(n). Note that in this structure, wherein the input signal to the adapter 24 is |p(n)| and the output signal from the adapter 24 is v(n).

The motivation behind this extension is that the DM 42 is a special case of DPCM 48, wherein the DPCM 48 uses multi-bit quantization and higher-order prediction (it is sufficient to assume a single delay predictor) and results in better coding. Therefore, using the DPCM 48 in the adapter 28 instead of a DM 42 should improve the tracking performance of the adapter 24.

The scaling factor 1/S of op-amp 46 adds flexibility and improves tracking performance for the adapter 24. Moreover, the range of the input to the DPCM 48 can be adjusted by tuning S.

Of course, the companded DPCM adapter 24 can also function as a stand-alone coder as well. For this reason, and for generality, the structure of FIG. 4 can redrawn as shown in FIG. 5, and its input signal denoted more generically by x(n) instead of |p(n)|.

The following describes the performance of the companded DPCM system, and the resulting multi-bit ASDM. Among other results, expressions for the mean and variance of the coding error are derived, as well as an expression for the SNR of the overall system. These results will be achieved by first showing how the companded system can be modeled as a single random gain with known statistics.

2.1 Random Gain Model

Figure 5:
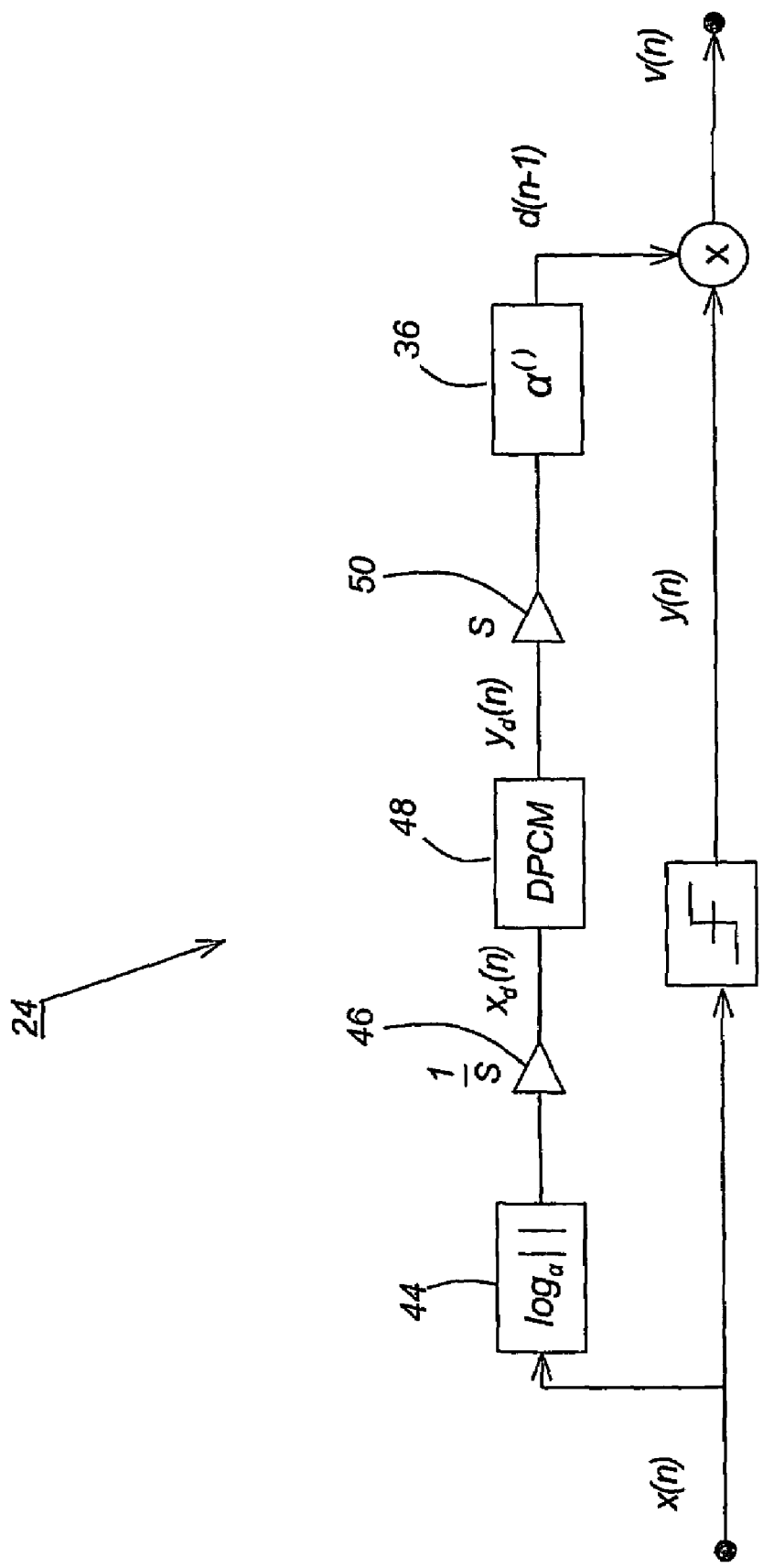
FIG. 5 illustrates a companded DPCM coder.

To begin with, from FIG. 5, the input to the DPCM 48, $x_d(n)$, is given by:

$$x_d(n) = \frac{1}{S} \log_\alpha |x(n)| \quad (1)$$

where x(n) is the input signal to the coder. The output of the DPCM 48, denoted by $y_d(n)$, is multiplied by the scaling factor S at op-amp 50 and then decompressed by the exponential term block 36 to give:

$$d(n) = \alpha^{Sy_d(n)} \quad (2)$$

and:

$$v(n) = y(n)d(n) \quad (3)$$

where y(n) is the sign of x(n).

The objective in this section is to show that the input-output mapping of the companded DPCM 48 of FIG. 5 (i.e., from x(n) to v(n)) can be modeled as:

$$v(n) = K(n)x(n)$$

for some random gain K(n) that is going to be characterized. This intermediate result will be very useful in characterizing the performance of the overall companded DPCM and multi-bit ASDM structures.

Figure 6A:
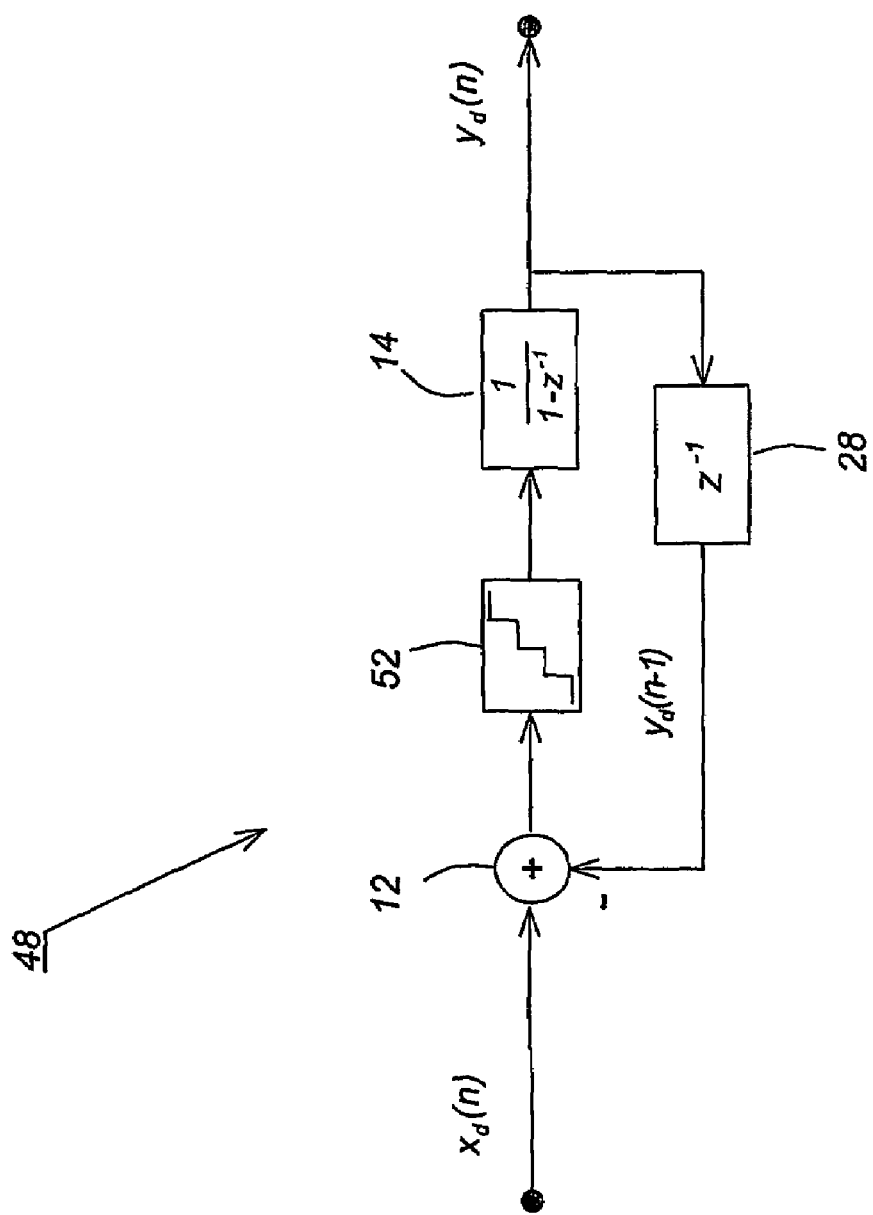
FIG. 6A illustrates a first-order DPCM structure and FIG. 6B illustrates a linearized DPCM structure.

FIG. 6A illustrates the structure of the original DPCM 48. The DPCM 48 of FIG. 6A includes a summing junction 12, multi-bit quantizer 52, integrator 14 and delay 28, wherein the input signal to the DPCM 48 is $x_d(n)$ and the output signal from the DPCM 48 is $y_d(n)$.

Figure 6B:
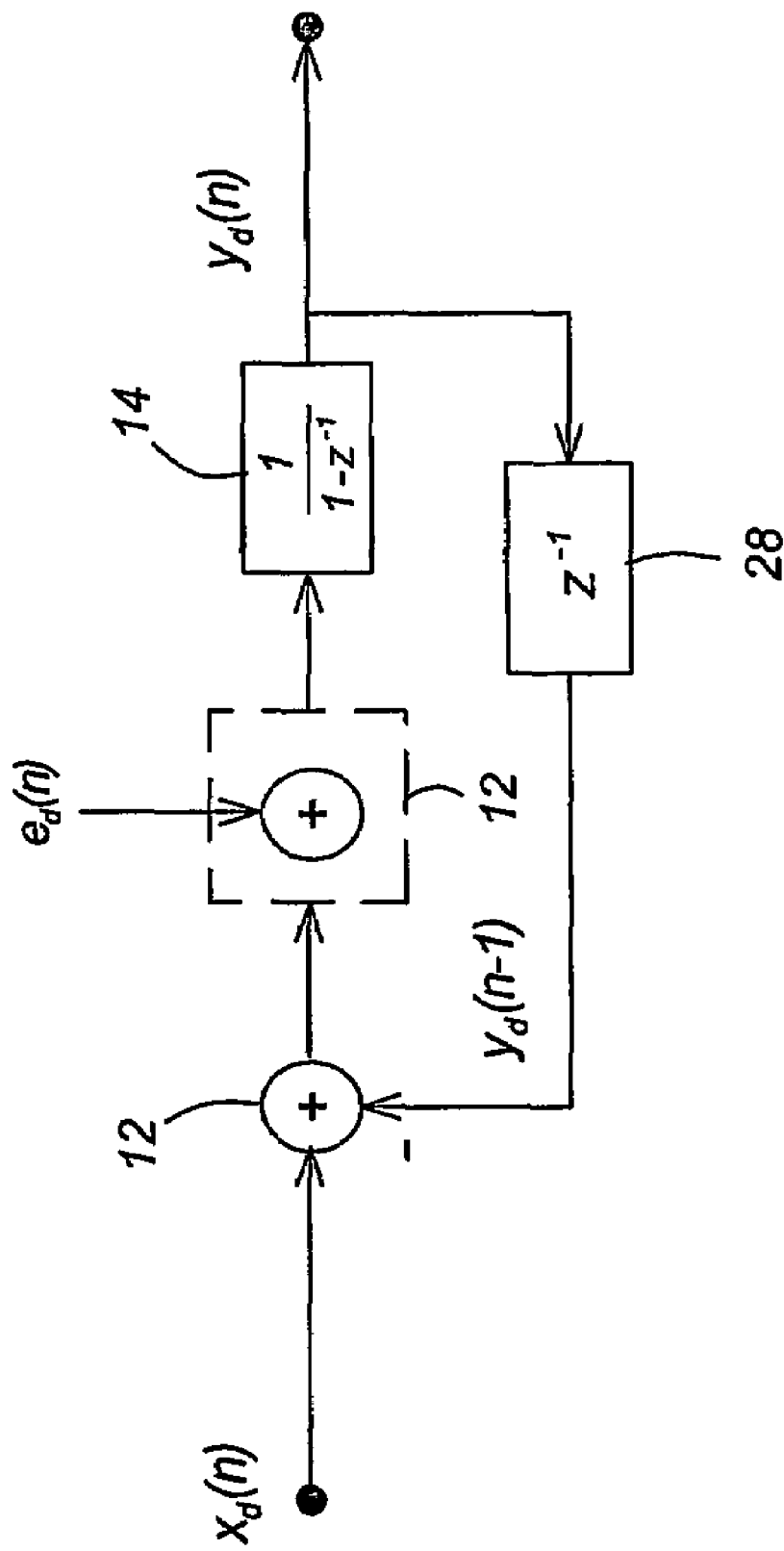

FIG. 6B illustrates a linearized version of the DPCM 48. The DPCM 48 of FIG. 6B is similar to FIG. 6A except that the multi-bit quantizer 52 is replaced by a summing junction 12 for an additive quanitization error $e_d(n)$ The additive quantization error $e_d(n)$ is assumed to be uniform within the interval:

$$\left[ -\frac{\Delta}{2}, \frac{\Delta}{2} \right]$$

where $\Delta = 2/2^B$ and B is the number of bits of the coder (B−1 bits are devoted to the quantizer 16 and the remaining bit carries the sign signal). The quantization error is further assumed to be independent of all other variables.

In the z-transform domain, the operation of the linearized DPCM 48 is described by:

$$Y_d(z) = \frac{\frac{1}{1-z^{-1}}}{1 + \frac{z^{-1}}{1-z^{-1}}} (X_d(z) + E_d(z))$$

which simplifies to:

$$Y_d(z) = X_d(z) + E_d(z)$$

In other words:

$$y_d(n) = x_d(n) + e_d(n)$$

so that using equation (1) results in:

$$y_d(n) = \frac{1}{S} \log_\alpha |x(n)| + e_d(n)$$

Substituting back into (2):

$$d(n) = \alpha^{S\left(\frac{1}{S}\log_\alpha |x(n)| + e_d(n)\right)}$$

This equation can be simplified to:

$$d(n) = |x(n)| \alpha^{Se_d(n)}$$

Now, since:

$$v(n) = y(n)d(n)$$

then:

$$v(n) = x(n) e^{Se_d(n)}$$

Finally, if the following is defined:

$$K(n) \triangleq \alpha^{Se_d(n)} \quad (3)$$

the desired relation is:

$$v(n)=K(n)x(n) \quad (4)$$

This result shows that the companded DPCM coder of FIG. 6B can be modeled by a single random gain $K(n)$, which is a function of S and $e_d(n)$ only. In the sequel, it is assumed that all random processes are stationary.

2.2 Signal-to-Noise (SNR) Performance

Now it is easy to verify that the first and second moments of $K(n)$ are given by:

$$E_K \triangleq E\{K\} = \int_{-\frac{\Delta}{2}}^{\frac{\Delta}{2}} \frac{1}{\Delta} \alpha^{S\eta} d\eta$$

$$= \frac{1}{\Delta S \ln(\alpha)} (\alpha^{S\Delta/2} - \alpha^{-S\Delta/2})$$

and:

$$E_{K^2} \triangleq E\{K^2\} = \int_{-\frac{\Delta}{2}}^{\frac{\Delta}{2}} \frac{1}{\Delta} \alpha^{2S\eta} d\eta$$

$$= \frac{1}{2\Delta S \ln(\alpha)} (\alpha^{S\Delta} - \alpha^{-S\Delta})$$

Let $e_c(n)$ denote the coding error:

$$e_c(n)=x(n)-v(n) \quad (5)$$

The above results allow an expression for the expected value and variance of $e_c(n)$ to be derived. To see this, the expected value of both sides of (4) is evaluated:

$$E\{v(n)\}=E\{K(n)x(n)\} \quad (6)$$

and the independence of $\{e_d(n)\}$ with all other variables is invoked to conclude that:

$$E_v = E_K E_x$$

and, therefore:

$$E_{e_c}=(1-E_K)E_x \quad (7)$$

Here, the notations $\{E_v, E_x, E_{e_c}\}$ are used to denote the means $\{v(n), x(n), e_c(n)\}$, respectively.

Moreover, by squaring both sides of the error expression (5), the following is obtained:

$$e_c^2(n)=x^2(n)-2x(n)v(n)+v^2(n)$$

Taking the expected value of both sides, it is found that:

$$E_{e_c^2}=E_{x^2}-2E_{xv}+E_{v^2}$$

Now since:

$$E_{xv}=E\{K(n)x^2(n)\}=E_K E_{x^2}$$

and:

$$E_{v^2}=E\{K^2(n)x^2(n)\}=E_{K^2}E_{x^2}$$

results in:

$$E_{e_c^2}=E_{x^2}-2E_K E_{x^2}+E_{K^2}E_{x^2}$$

In other words:

$$E_{e_c^2}=(1-2E_K+E_{K^2})E_{x^2} \quad (8)$$

The variance of the coding error is:

$$\sigma_{e_c}^2 \triangleq E_{e_c^2}-(E_{e_c})^2$$

and from (7) and (8) the following is obtained:

$$\sigma_{e_c}^2=(1-2E_K+E_{K^2})E_{x^2}-(1-E_K)^2 E_x^2 \quad (9)$$

Finally, in computing the SNR, it is assumed that the input signal is zero mean (so that $\sigma_{e_c}^2 = E_{e_c^2}$) Therefore, equation (9) can be rewritten as:

$$\sigma_{e_c}^2=(1-2E_K+E_{K^2})\sigma_x^2 \quad (10)$$

The SNR is defined as $SNR=\sigma_x^2/\sigma_{e_c}^2$. Using equation (10), the variance of the input signal $\sigma_x^2$ will cancel out, leading to the following expression:

$$SNR = \frac{1}{1-2E_K+E_{K^2}} \quad (11)$$

The theoretical SNR is therefore independent of the input strength. In summary, the following result is obtained:

Theorem 1: SNR of the Companded DPCM. For the companded DPCM coder of FIG. 5, the coding error $e_c(n)=x(n)-v(n)$ has zero mean and variance:

$$\sigma_{e_c}^2 = (1-2E_K+E_{K^2})\sigma_x^2$$

where:

$$E_K = \frac{1}{\Delta S \ln(\alpha)} (\alpha^{S\Delta/2} - \alpha^{-S\Delta/2})$$

$$E_{K^2} = \frac{1}{2\Delta S \ln(\alpha)} (\alpha^{S\Delta} - \alpha^{-S\Delta})$$

and $\sigma_x^2$ is the variance of the input $x(n)$. The constants $\Delta$, S, and $\alpha$ are the quantizer step-size, the scaling factor of the DPCM input, and the exponent term, respectively. Furthermore, the SNR of this coder is independent of the input strength and given by:

$$SNR = \frac{1}{1-2E_K+E_{K^2}}$$

2.3 Simulations

Figure 7:
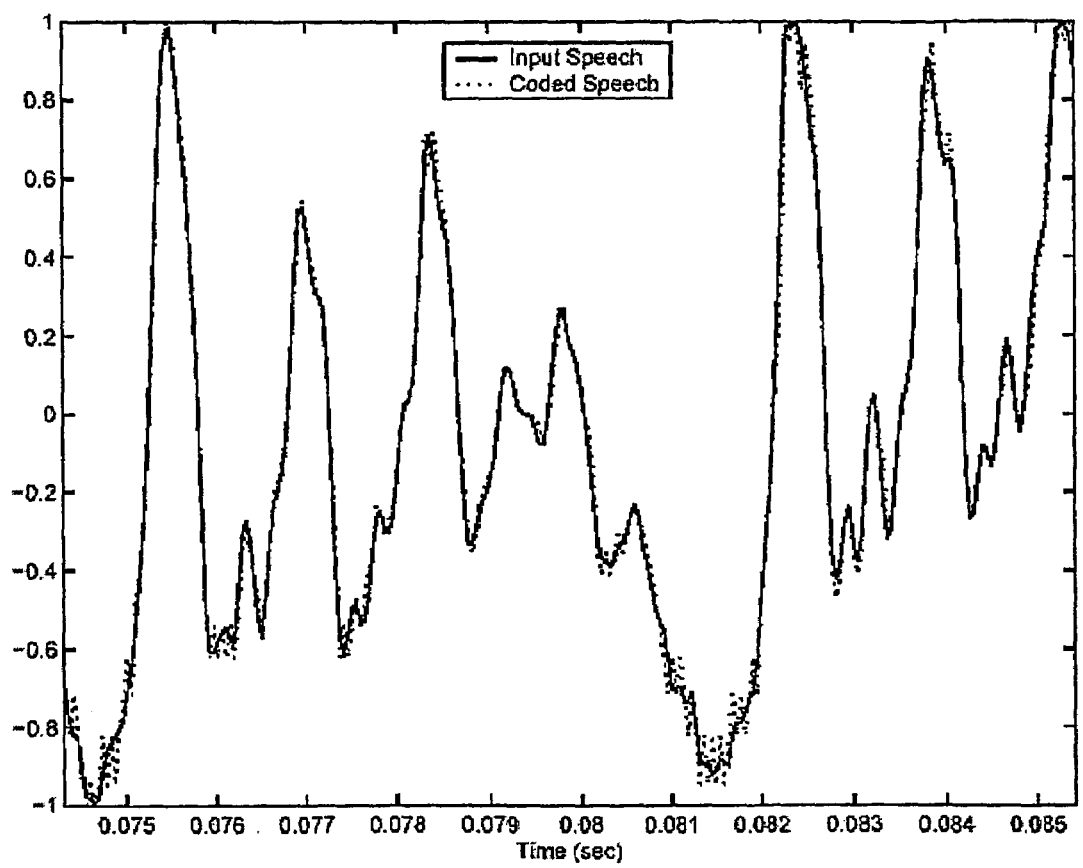
FIG. 7 is a graph that shows the output of the companded DPCM coder tracking an input speech signal.

The companded DPCM coder was simulated using Matlab. FIG. 7 shows the output v(ii) tracking a speech input sampled at $F_s=22$ kHz. The exponent term $\alpha$, the scaling factor S, and the number of bits B are chosen as 1.25, 5, and 4, respectively. The figure shows a close tracking even at high variations in the speech signal.

Figure 8:
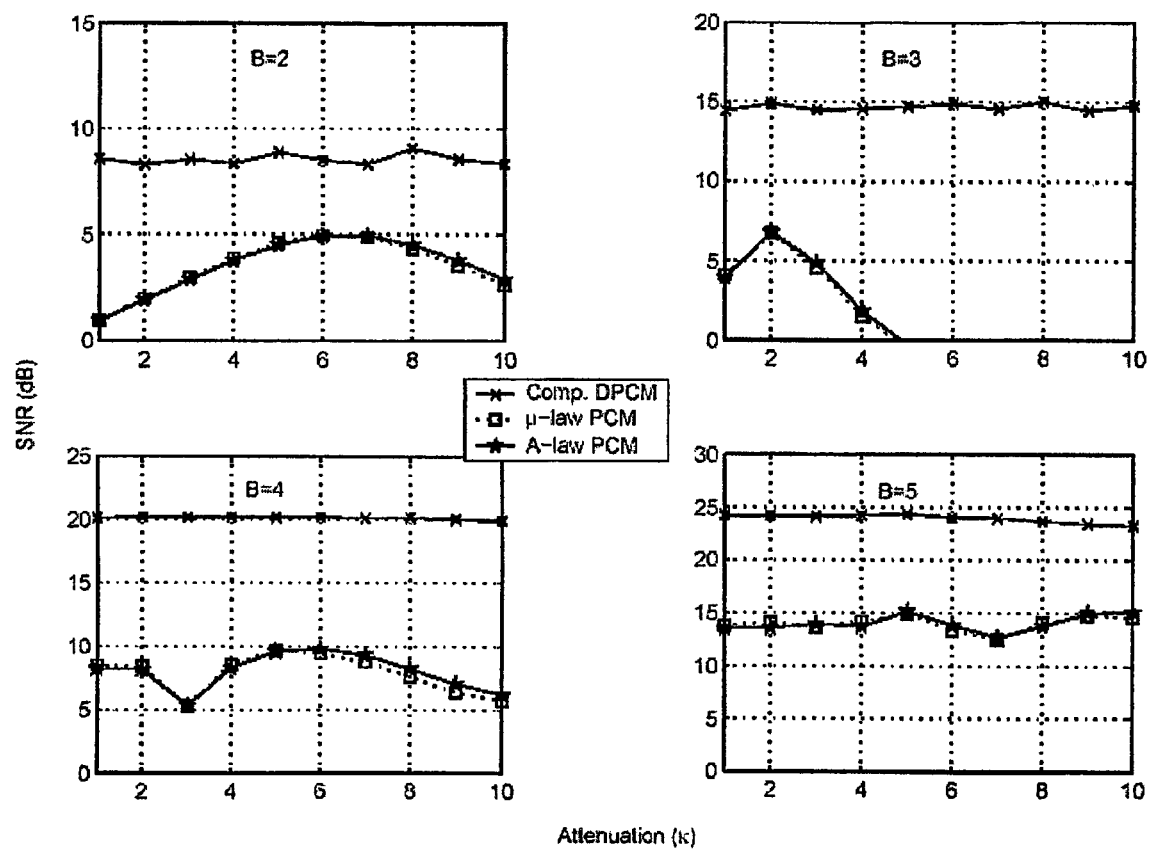
FIG. 8 is a graph that shows the SNR performance of the companded DPCM coder compared to other two schemes (B=[2-5])

Next, the dynamic range of the coder was investigated. In this test, the input signal is attenuated by a factor $\kappa$ and then run through the coder. The resulting SNR of the coder was measured. A different value of $\kappa$ was chosen and the process was repeated. FIG. 8 shows the resulting SNR versus the attenuation factor $\kappa$ together with that obtained using μ-law PCM and A-law PCM for B=[2-5]. The proposed coder demonstrates higher SNR performance than the other two coders. Furthermore, the proposed coder shows almost flat SNR performance over input strength outperforming the other two coders and resulting in a noticeably higher dynamic range.

Figure 9:
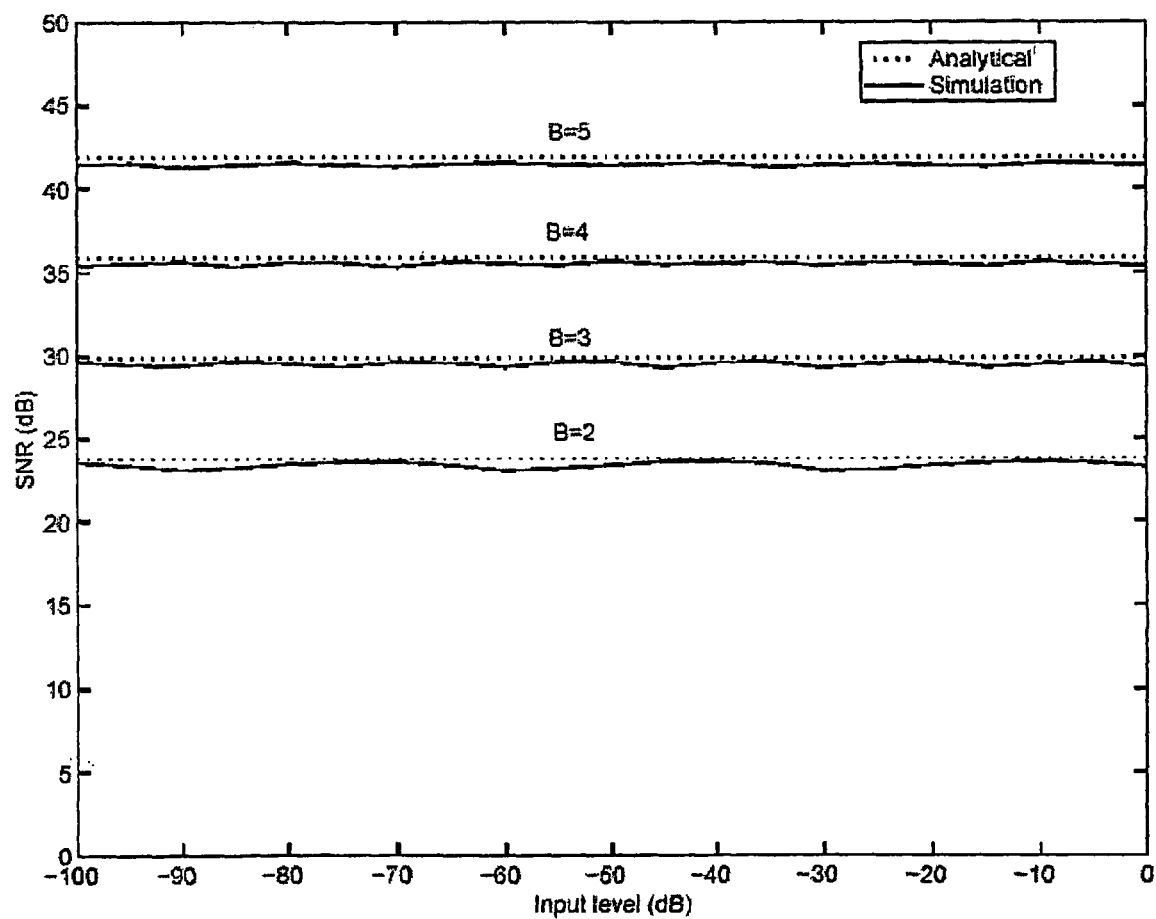
FIG. 9 is a graph that shows a comparison of theoretical and simulated SNR for the companded DPCM coder.

FIG. 9 shows a comparison between the theoretical SNR derived earlier, in equation (11), and the simulated SNR for B=[2-5]. A sine waveform input was used in this simulation and the scaling factor S was chosen to be unity. The figure shows a close match between the two quantities.

3 Multi-Bit Adaptive Sigma-Delta Modulation (ASDM)

Figure 10:
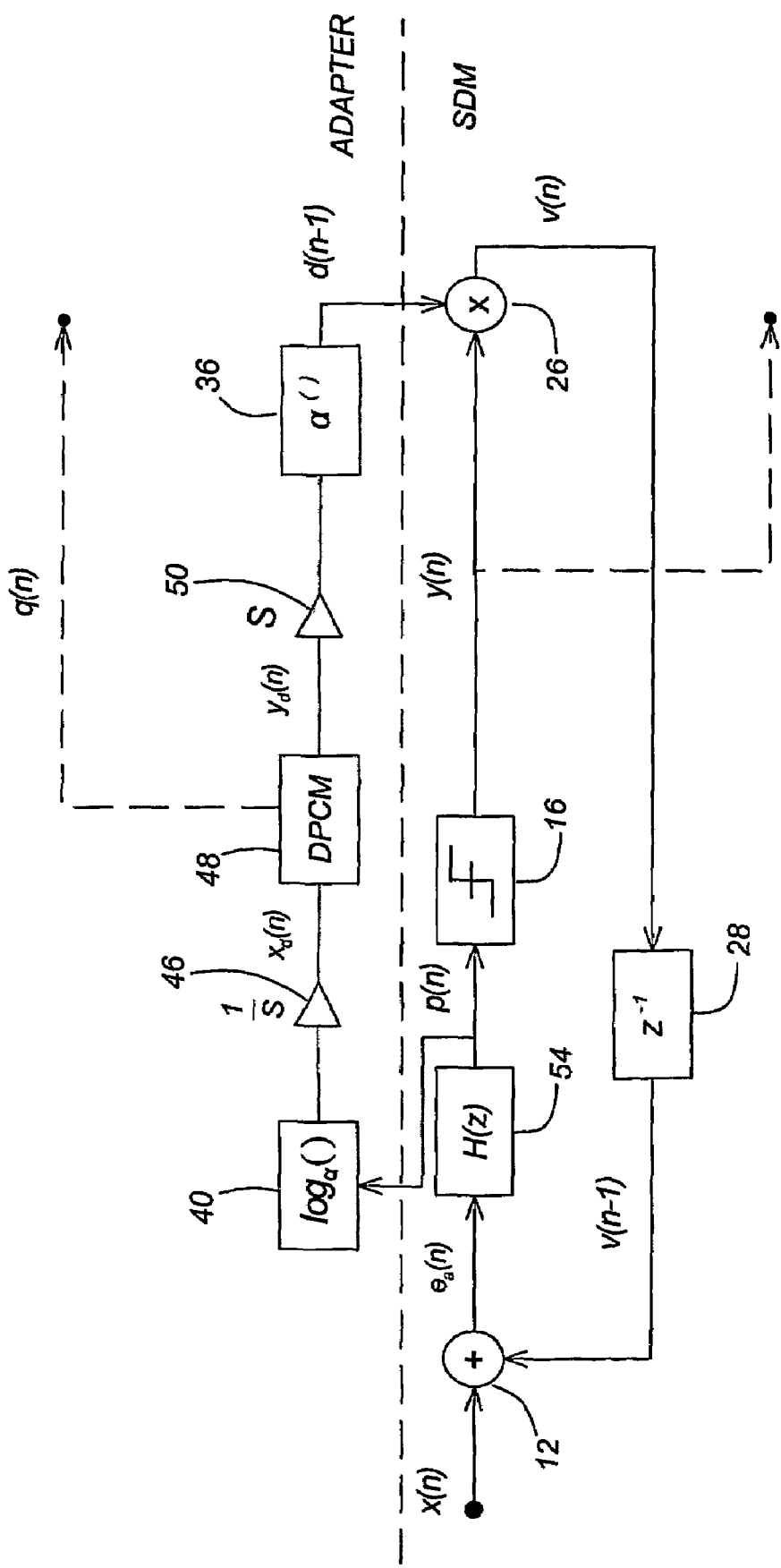
FIG. 10 illustrates a structure for multi-bit adaptive sigma-delta modulation.

As explained before, besides functioning as a stand-alone coder, the companded DPCM 48 of FIG. 5, with x(n) replaced by p(n) as in FIG. 4, can be used to adapt the step-size of the ASDM of FIG. 1. The resulting structure is shown in FIG. 10. The main loop is a conventional single-bit SDM with a noise shaping filter H(z) 54. The results of the previous section can then be used to characterize the performance of the resulting ASDM structure.

3.1 SNR Performance

Figure 11:
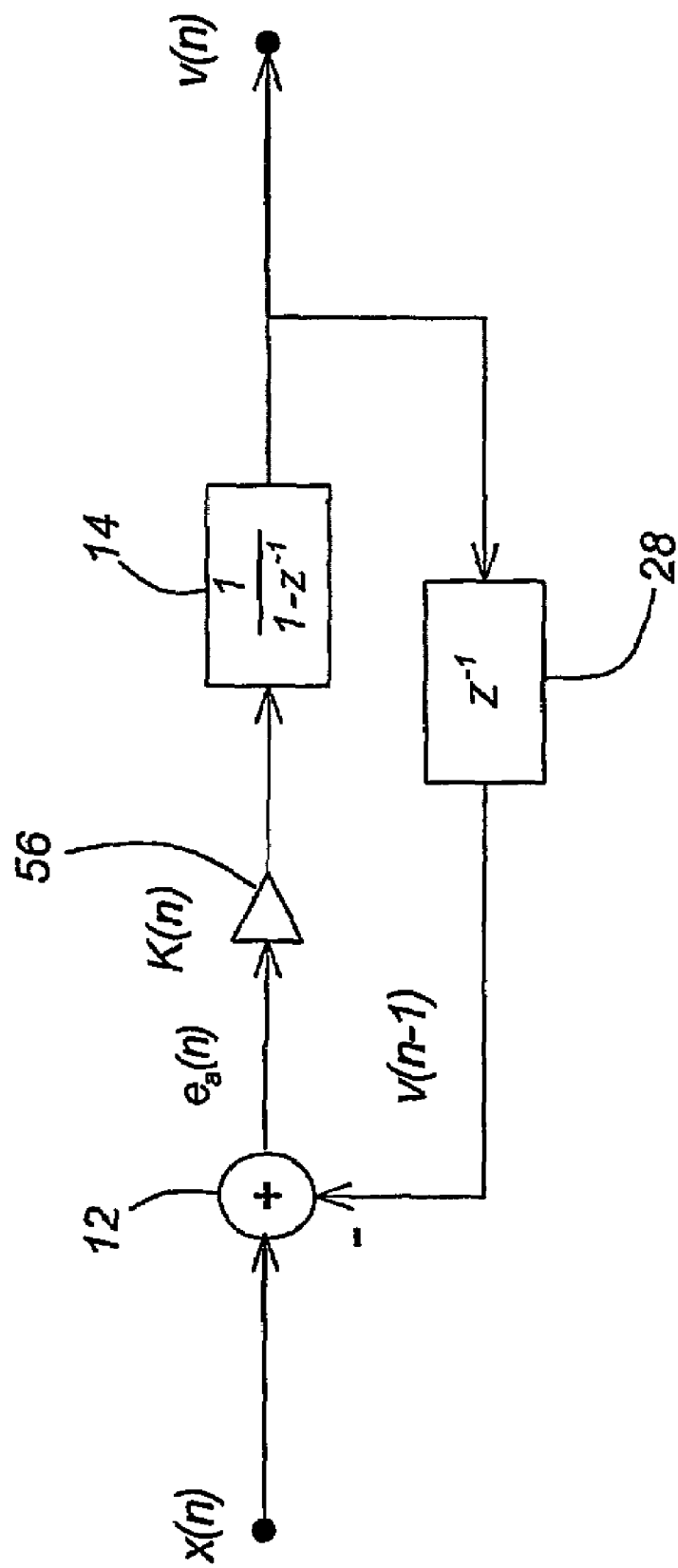
FIG. 11 is a graph that shows a linearized random-gain model for the multi-bit adaptive sigma delta modulator.

Section 2 above showed that the input-output mapping of the companded DPCM 48 can be modeled as the random gain 56, having a value $K(n)=\alpha^{Se_d(n)}$, where $e_d(n)$ is the quantization error associated with the quantizer 16. Therefore, the functionality of the multi-bit ASDM structure can be modeled as shown in FIG. 11. The difference between this model and the one developed in [7] for the single-bit case lies in the values of the first and second-order moments of gain K(n) 56. In the multi-bit case, as can be seen from the statement of Theorem 1, these moments depend on S and the value of Δ is now smaller.

Therefore, the derivation carried out in the single-bit case in [7] can be extended rather directly to the multi-bit case resulting in the following SNR expression for the multi-bit ASDM system:

$$SNR = \frac{R}{(1 - 2\Gamma A^{-1} 1)(\psi E_{K^2} - 1)} \quad (12)$$

where the quantities $\{A, \Gamma, 1, \psi, R\}$ are defined as follows:

$$\beta = \frac{1}{E_K}$$

$$A = \begin{pmatrix} 1+\beta & 1 & 1 & \cdots & 1 \\ 2 & 1+\beta & 1 & \cdots & 1 \\ 2 & 2 & 1+\beta & \cdots & 1 \\ \vdots & \vdots & \vdots & \cdots & \vdots \\ 2 & 2 & 2 & \cdots & 1+\beta \end{pmatrix} (M \times M)$$

$$\Gamma = \left[\frac{\sin(\omega_B)}{\omega_B} \frac{\sin(2\omega_B)}{2\omega_B} \cdots \frac{\sin(M\omega_B)}{M\omega_B}\right](1 \times M)$$

$$1 = [1\ 1\ 1\ \ldots\ 1]^T (M \times 1)$$

$$\psi = \frac{2 - E_K}{E_K(2E_K - E_{K^2})}$$

The constant R is the oversampling ratio (OSR) and $\omega_B$ is the bandwidth of the input signal in radians/sec. The matrix size M is an integer approximation of the span of the autocorrelation function of the modulation error. A typical value for M is between 4 and 10. Thus, observe again that the theoretical SNR is independent of the input signal strength.

3.2 Simulations

Figure 12:
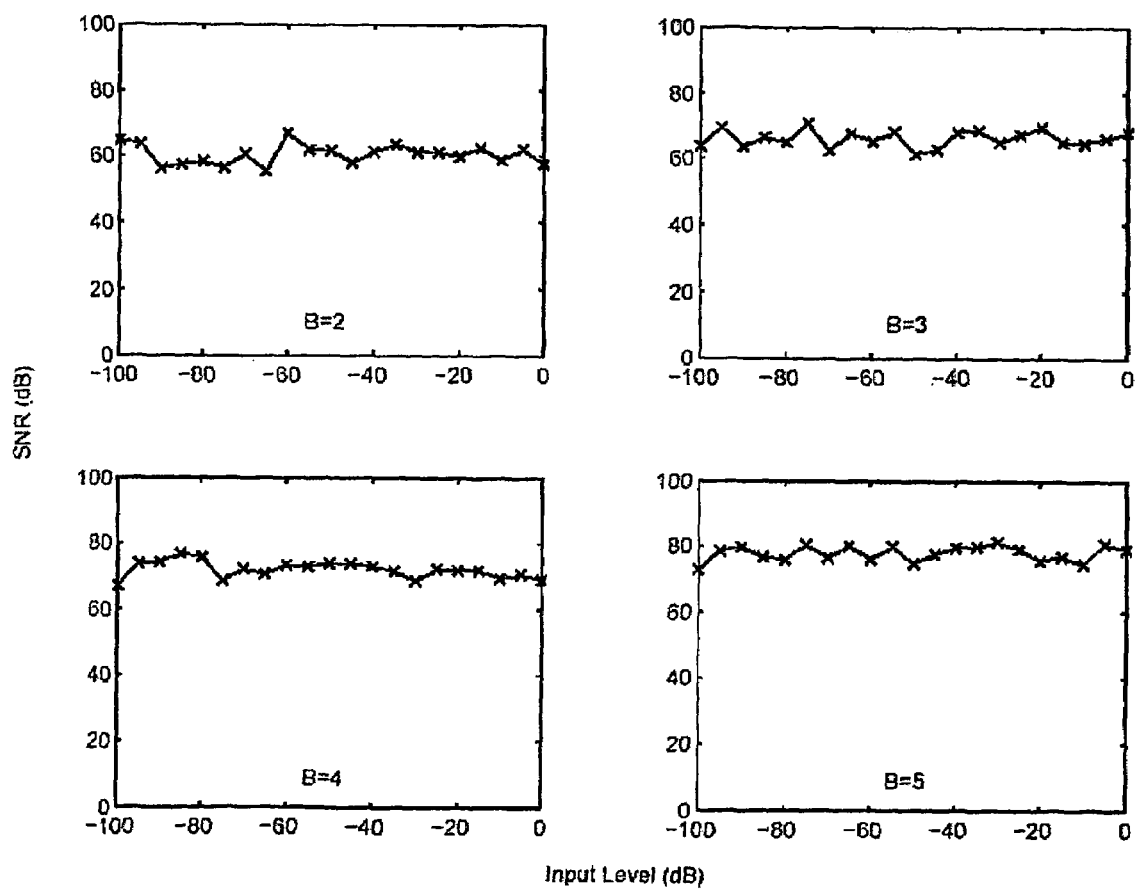
FIG. 12 is a graph that shows the SNR performance of the multi-bit ASDM over input level for B=2-5.
Figure 13:
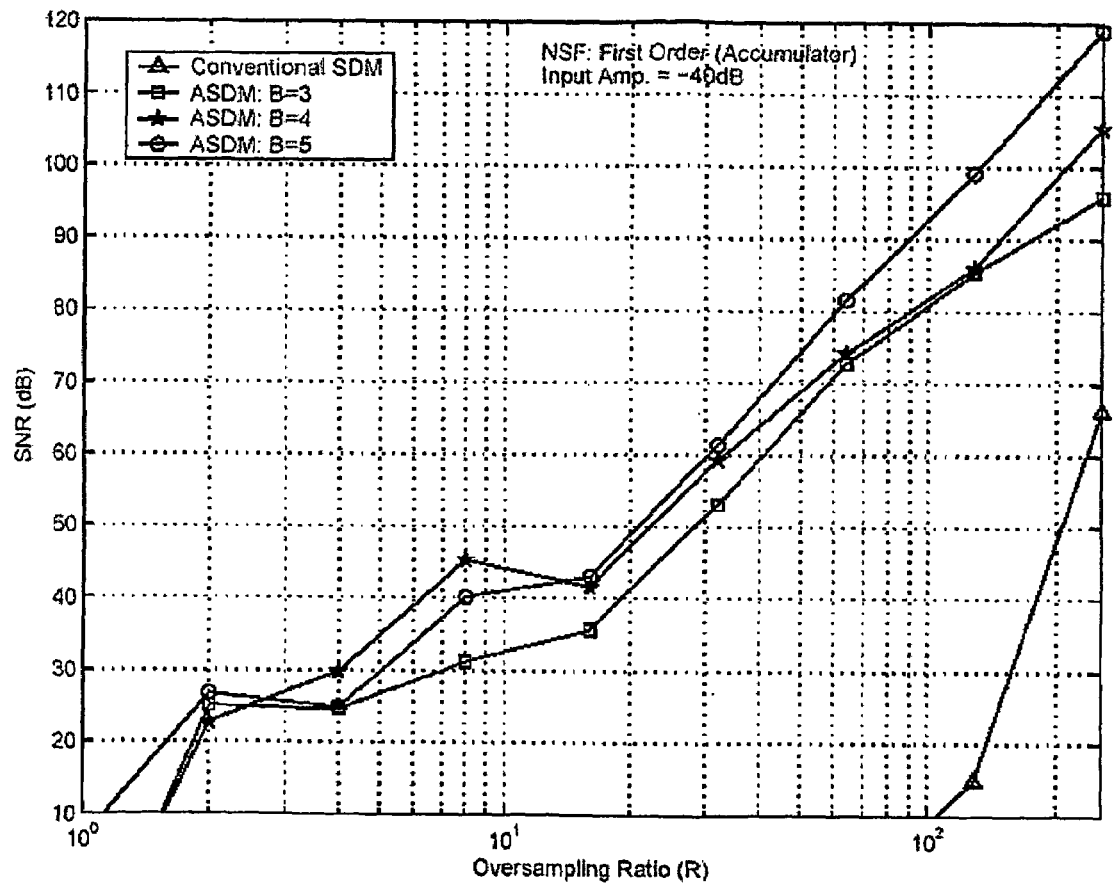
FIG. 13 is a graph that shows the SNR dependence of the multi-bit ASDM on the oversampling ratio R for B={3,4,5} bits.

The multi-bit ASDM was simulated using Matlab with a sinusoidal input. The parameters α, S, and the oversampling ratio (R) were chosen as 2.2, 1, and 64, respectively. FIG. 12 shows the SNR performance of the proposed modulator for B=2-5 bits. From these figures, the following can be observed. First, the SNR shows a flat response over input level supporting the, theoretical findings. Second, the SNR increases by an average of 6 dB with 1-bit increase in the quantizer. FIG. 13 shows the SNR dependence on the oversampling ratio R for B=3-6 bits at −5 dB input amplitude. The plot also includes the performance of the conventional SDM for the sake of comparison.

Figure 14:
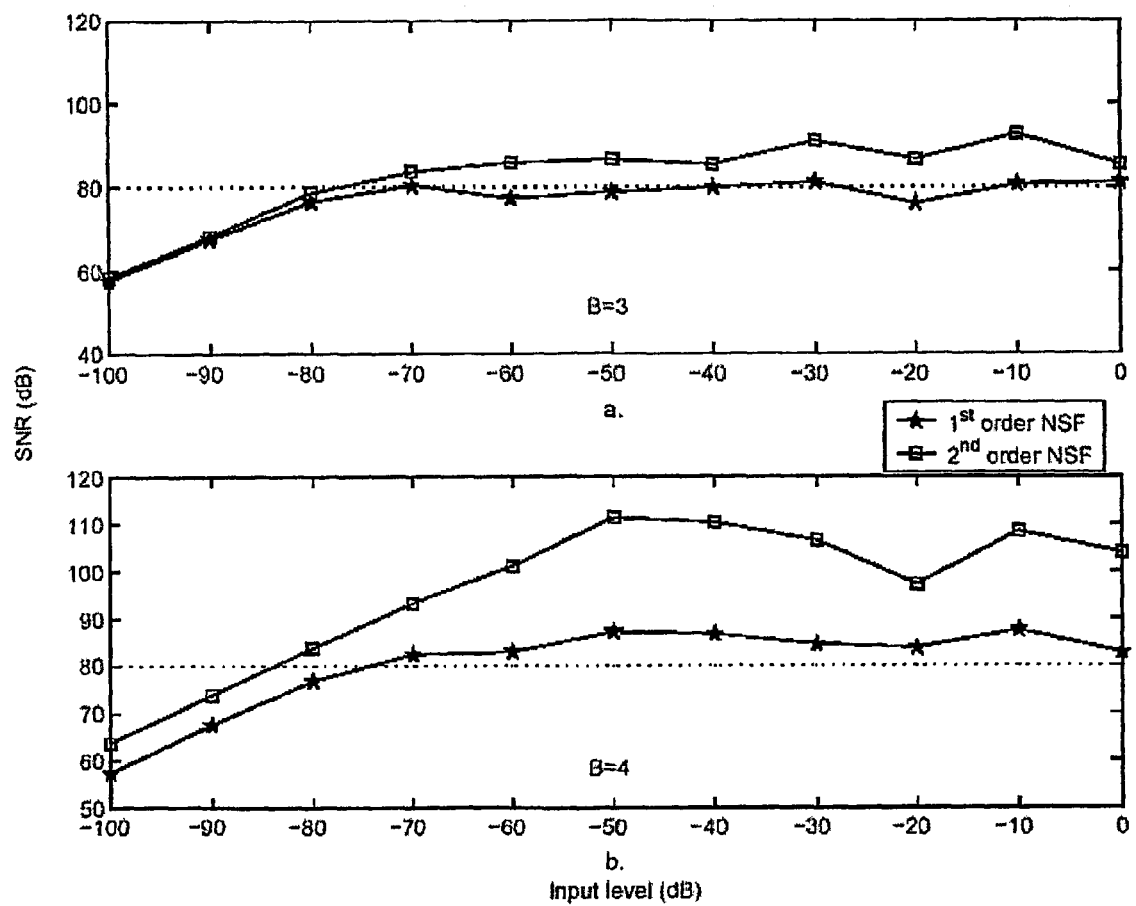
FIG. 14 is a graph that shows the effect of increasing the order of the NSF on the SNR of the multi-bit ASDM.

In another test, the effect of increasing the order of the noise shaping filter (NSF) H(z) on the performance of the modulator was investigated. FIG. 14 shows the SNR versus the input level for B=3-4 and for 1st and 2nd order NSF. The figure shows an improvement of up to 14 dB in SNR when B=3 bits and up to 24 dB improvement when B=4 bits.

Figure 15:
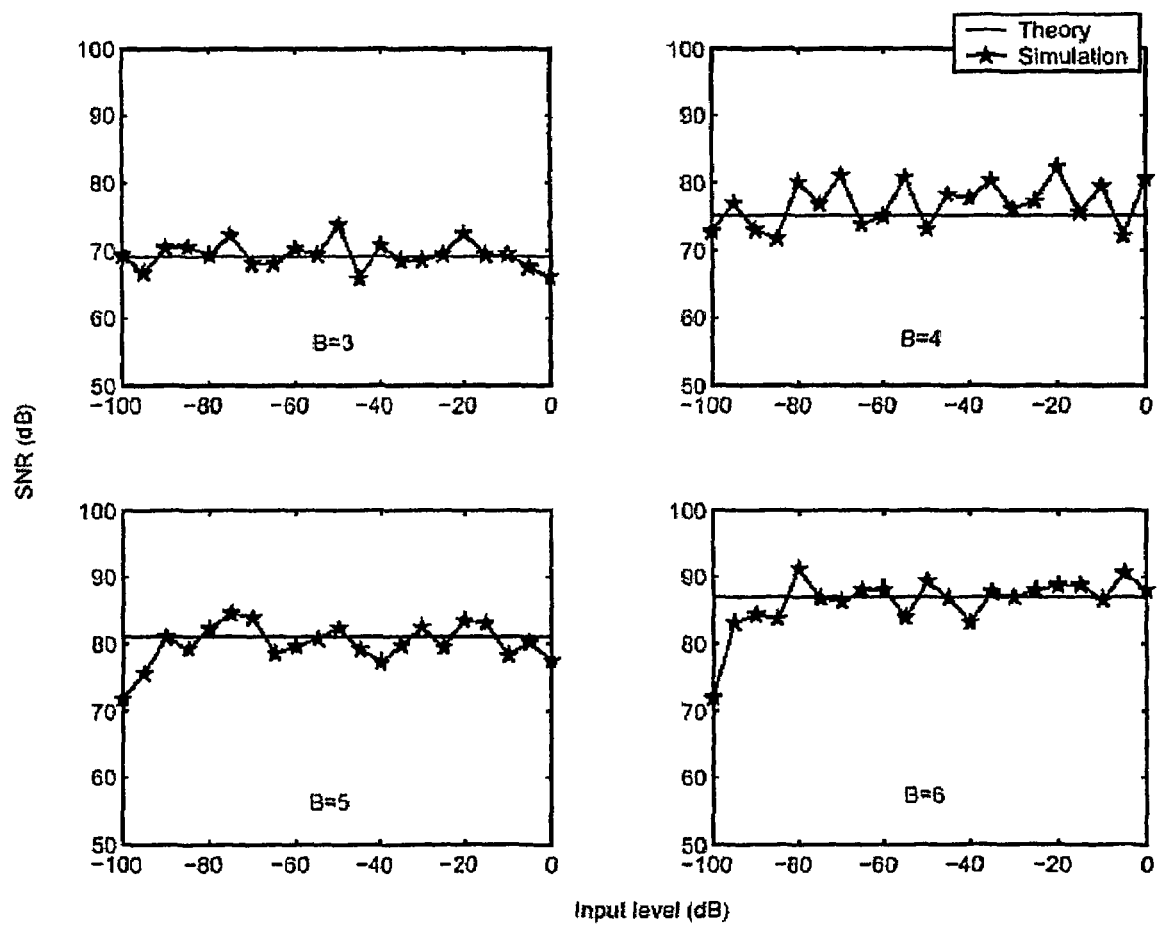
FIG. 15 is a graph that shows a comparison between SNR values resulting from theory and simulation for different bits for the multi-bit ASDM.

The expression for SNR shown in (12) was tested by comparing it with simulation results. FIG. 15 shows a comparison between the theoretical and simulated SNR for a sinusoidal input with R=64, S=1, α=1.95, and B=[3, 6]. The plot shows a close match between theory and simulations.

Figure 16:
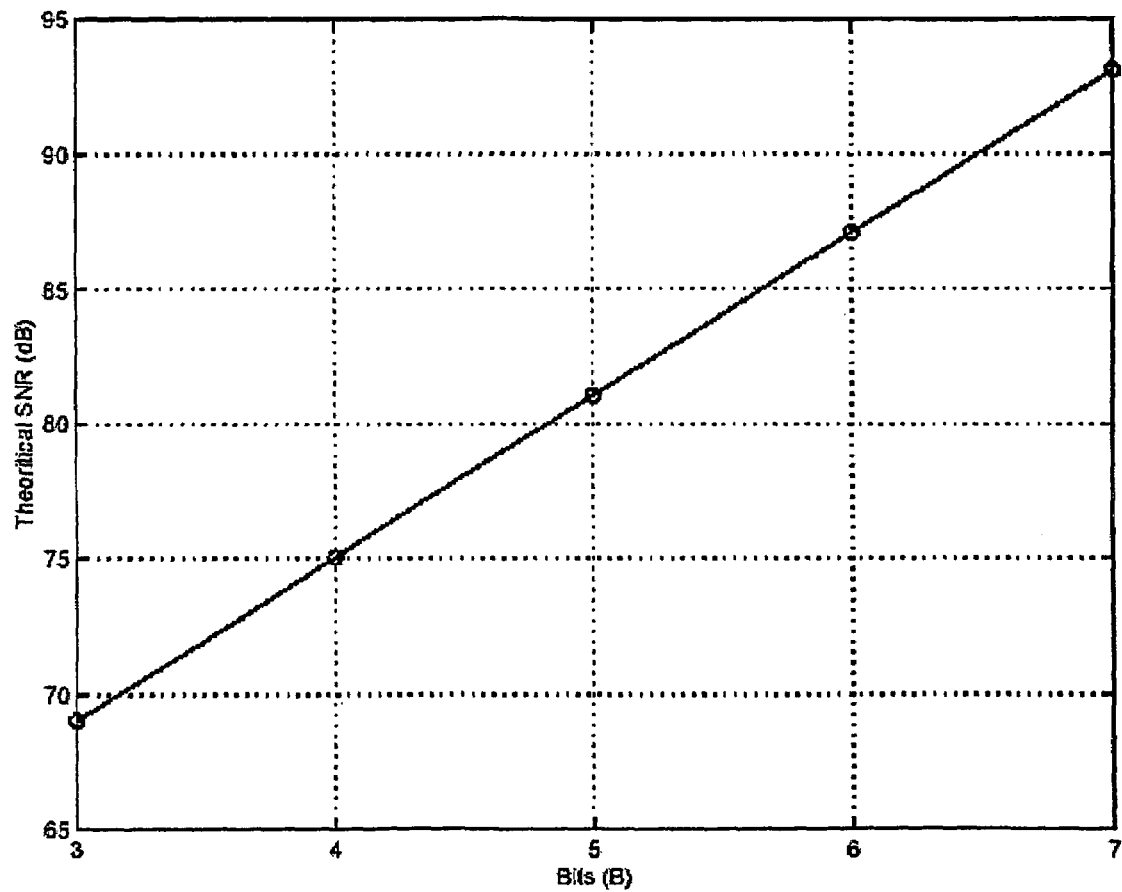
FIG. 16 is a graph that shows the theoretical SNR versus number of bits for the multi-bit ASDM.

Finally, the theoretical SNR is plotted against the number of bits B of the overall modulator. The result is shown in FIG. 16. The SNR increases by 6 dB as a result of increasing the number of bits by one.

It may be remarked that since ASDM implementation employs analog circuitry, circuit noise becomes a limiting factor such as noise generated by the ADC nonlinearity and thermal noise. While these are relevant issues, the focus in this application is on modeling and studying the performance of the proposed structures.

4 Adaptive Differential Pulse Code Modulation (LPCM)

Figure 17:
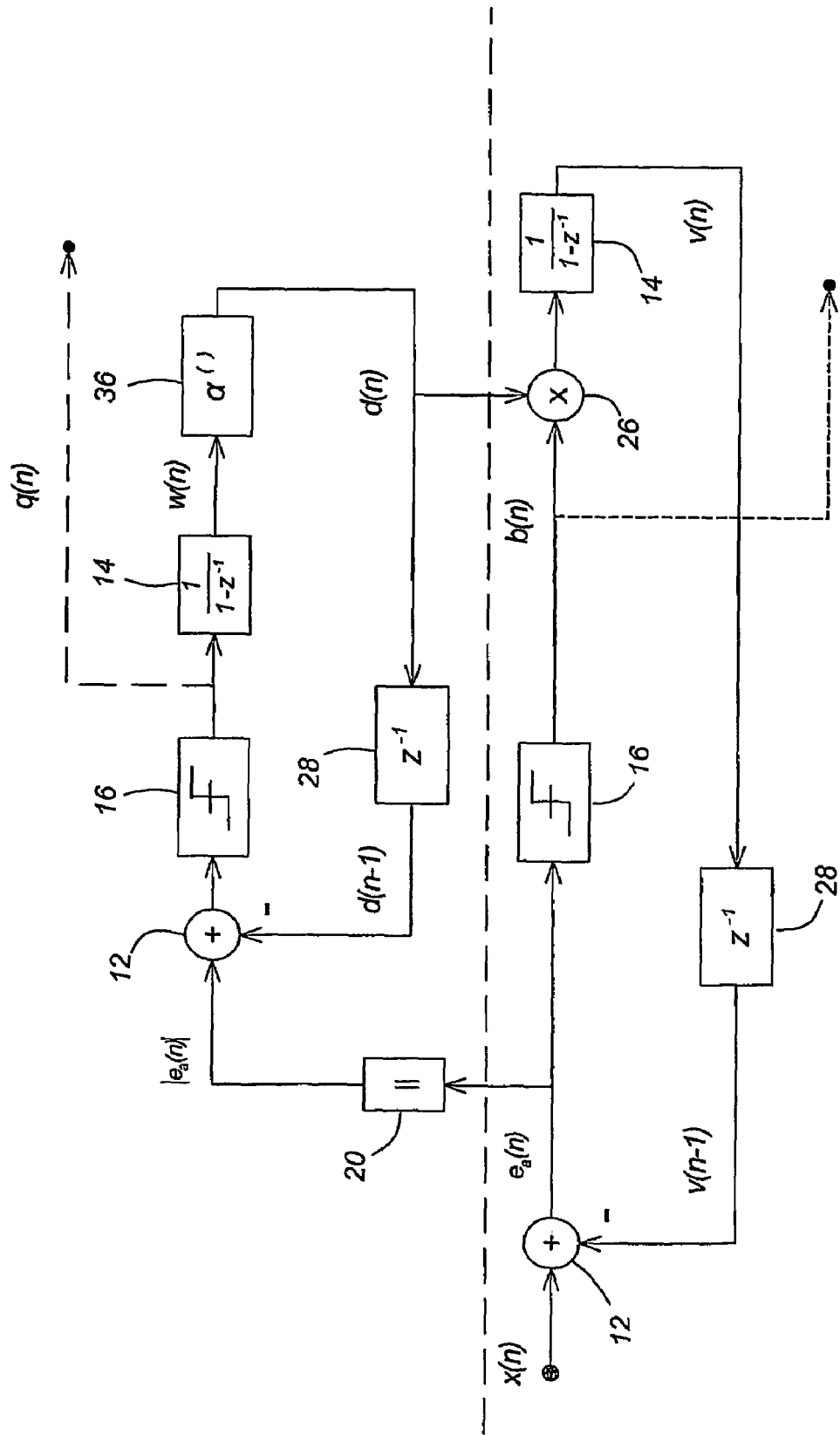
FIG. 17 illustrates a structure for single-bit adaptive delta modulation.

In a related work [8], a structure for adaptive delta (as opposed to sigma-delta) modulation with improved tracking performance was also proposed. The modulator is shown in FIG. 17 and its operation is described by the equations:

$$e_a(n) = x(n) - v(n-1)$$

$$q(n) = \text{sign}[|e_a(n)| - d(n-1)]$$

$$d(n) = \alpha^{q(n)}$$

$$v(n) = v(n-1) + \text{sign}[e_a(n)]d(n)$$

Again, the key difference in relation to other adaptive delta modulators (e.g., [12]-[13]) is that the adaptation procedure uses the input to the quantizer rather than the original input itself.

First, the following variables are introduced:

$$x_d(n) \triangleq \log_\alpha(|p(n)|)$$

$$y_d(n) \triangleq \log_\alpha(d(n))$$

Figure 18:
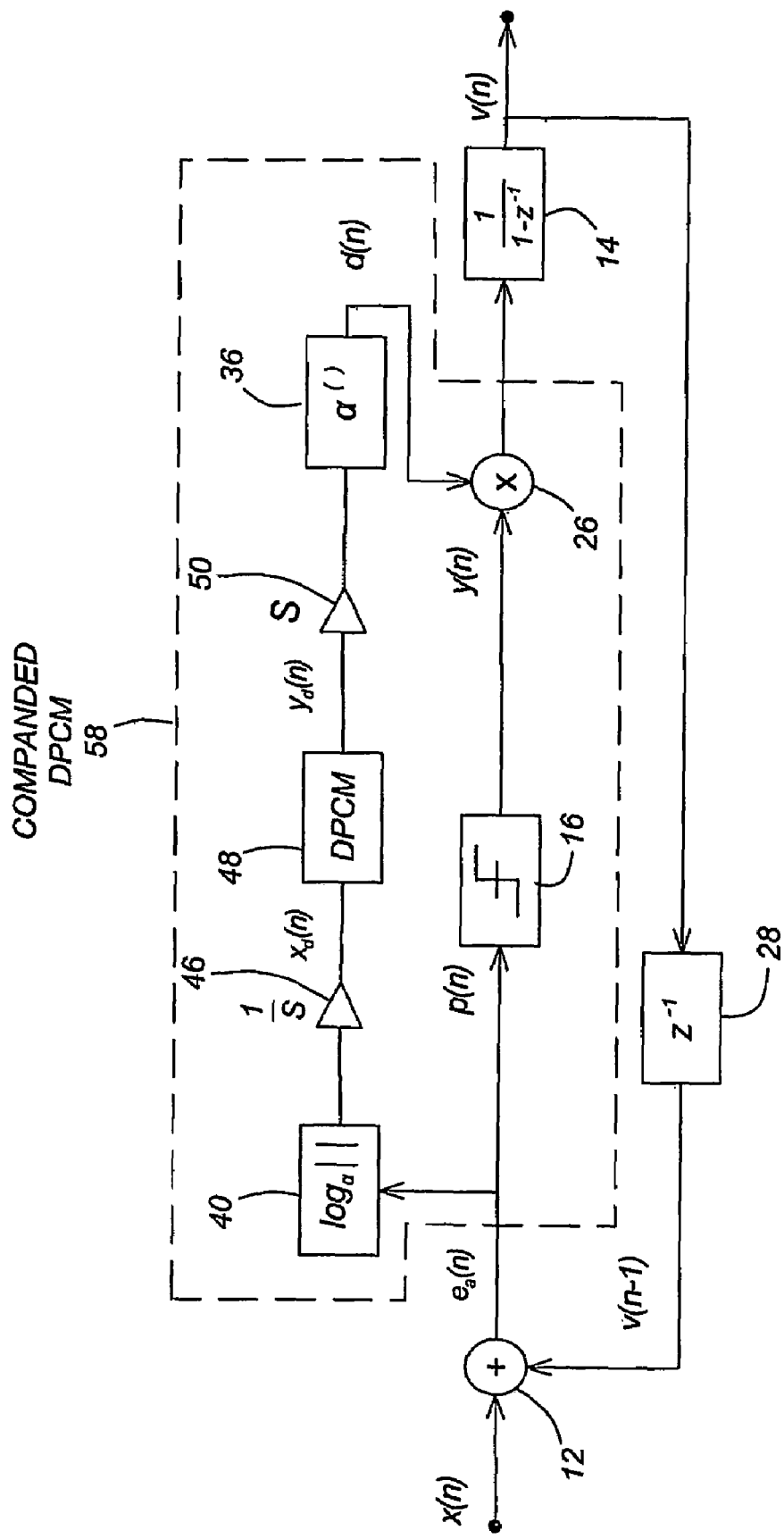
FIG. 18 illustrates a structure of an adaptive differential pulse code modulator (ADPCM) coder.

Observe again that the adaptation scheme in the upper branch of the figure amounts to delta modulation as well. Therefore, an extension to the multi-bit case can again be obtained by replacing the DM adaptive scheme with the companded DPCM 58 shown in FIG. 18. The resulting structure is referred to as an ADPCM system. It will be seen in this section that this structure maintains the same high dynamic range performance of the ADM and log-DPCM structures and also has improved SNR.

4.1 Performance

From the discussions in the previous sections it is already known that the following can be written:

$$v(n) = K(n)x(n) \quad (13)$$

where:

$$K(n) \triangleq \alpha^{Se_d(n)} \quad (14)$$

In other words, the companded DPCM part of this coder can be replaced by the random gain K(n). Now, it was shown in [8] that the single-bit ADM coder is BIBO stable. This conclusion can be extended to the multi-bit case by relying on the random gain model.

Thus, note that, since:

$$v(n)=(1-K(n))v(n-1)+K(n)x(n) \quad (15)$$

the following is obtained:

$$v(n) = \sum_{i=1}^{n} \prod_{j=i}^{n} (1-K(j))K(i)x(i) \quad (20)$$

If the input signal x(n) has a bound Λ, then:

$$|K(n)x(n)| \leq \Lambda |K(n)| \quad (15)$$

and using an analysis similar to the single-bit case from [8], it can be verified that if α is chosen in the open interval:

$$2^{\frac{2}{S\Delta}} < \alpha < 2^{\frac{2}{S\Delta}} \quad (16)$$

then a bound L can be found such that:

$$|1-K(n)| \leq L < 1 \quad (35)$$

Using this result, the following can then be written:

$$|v(n)| \leq \alpha^{S\Delta/2} \Lambda \sum_{i=1}^{n} L^j \quad (17)$$

and it can be concluded that the modulator output is bounded by:

$$|v(n)| \leq \alpha^{S\Delta/2} \Lambda \frac{L}{1-L}$$

so that the modulator is BIBO stable under the sufficient condition (16).

4.2 Simulations

Figure 19:
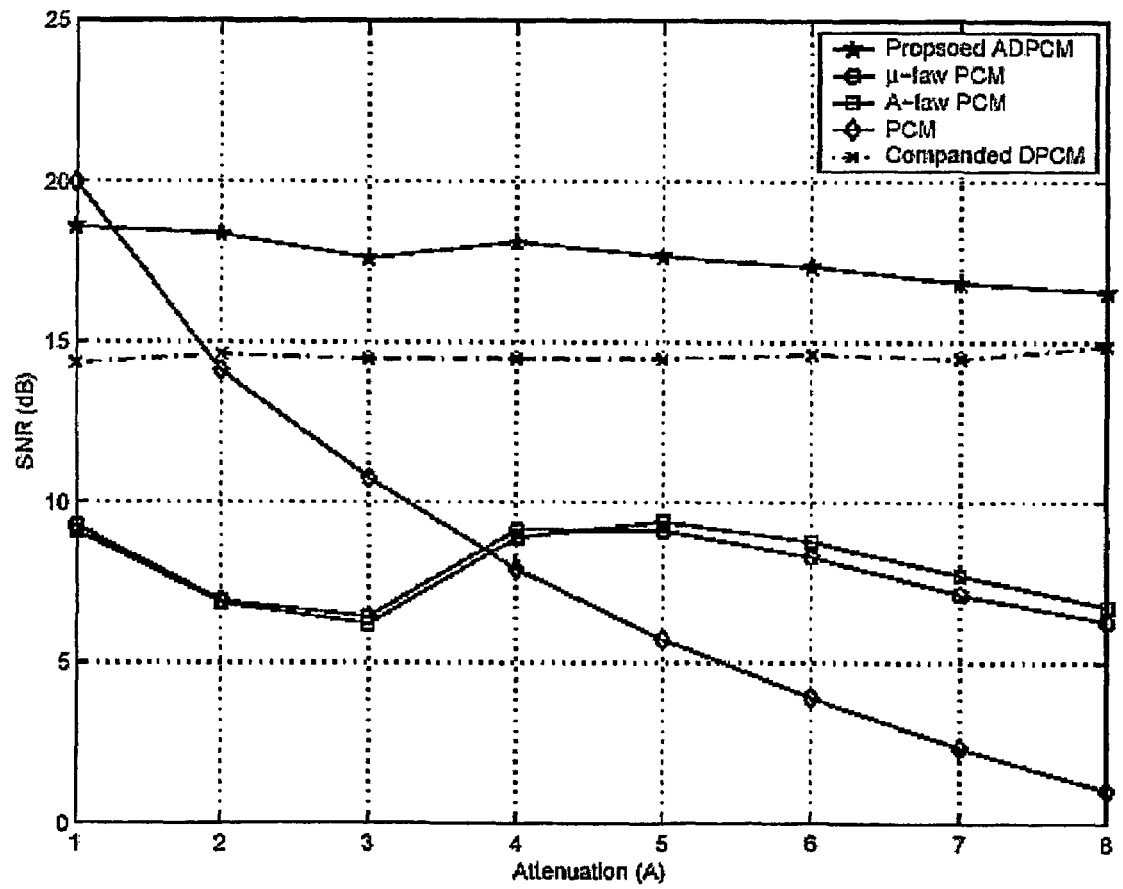
FIG. 19 is a graph that shows the SNR performance of five coding schemes with different attenuation factors for B=3.

The performance of the ADPCM coder was tested via simulations. A speech waveform was coded at a bit rate of 32 kHz using the proposed coder. The parameters α and S were chosen as 1.8 and 5, respectively. The SNR was used as a qualitative measure of the quality of the decoded speech. In order to test the dynamic range of the coder, the same experiment was conducted as in the DPCM case. Different attenuation factors κ were applied to the input speech and the SNR was measured for each value of κ. The result is shown in FIG. 19 with B=3 together with that obtained using PCM and μ-law PCM for the sake of comparison. Unlike other schemes, the SNR obtained by the proposed coder is independent of the input strength with improvement of about 9 dB over μ-law PCM.

Figure 20:
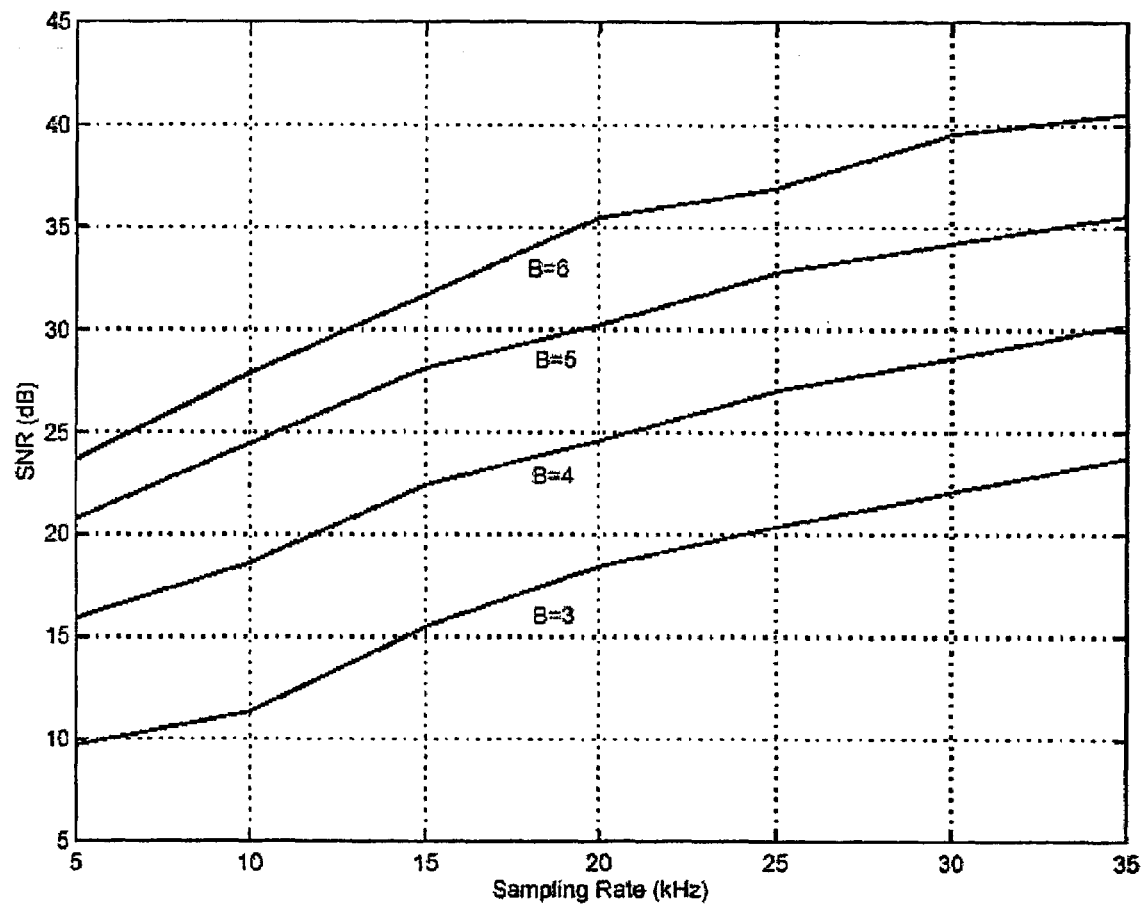
FIG. 20 is a graph that shows the SNR of the ADPCM coder versus sampling rate for different values of B.

In a different experiment, the effect of the input sampling rate on the performance of the coder was investigated. FIG. 20 shows the SNR performance versus sampling rate of the input speech at different number of bits. The SNR changes approximately in a linear fashion with respect to the sampling rate.

5 References

The following references are incorporated by reference herein:

[1] Owen, F., PCM and Digital Transmission Systems, McGraw-Hill Book Company, New York, 1982.
[2] S. Hein and A. Zakhor, Sigma Delta Modulators, Nonlinear Decoding Algorithms and Stability Analysis, Kluwer Academic Publishers, MA, 1993.
[3] S. Norsworthy, R. Schreier, and G. Temes, Delta-Sigma Data Converters, IEEE Circuits and Systems Society, IEEE Press, NJ, 1997.
[4] Proakis, J., Digital Communications, McGraw-Hill Higher Education, NY, 2001.
[5] L. Robiner and R. Schafer, Digital Processing of Speech Signals, Prentice-Hall, NJ, 1978.
[6] P. Aziz, H. Sorensen, and J. Spiegel, "An overview of sigma-delta converters," IEEE Signal Processing Magazine, vol. 13, no. 1, pp. 61-84, January 1996.
[7] M. A. Aldajani and A. H. Sayed, "Stability and performance analysis of an adaptive sigma-delta modulator," IEEE Trans. on Circuits and Systems II: Analog and Digital Signal Processing, vol. 48, no. 3, pp. 233-44, March 2001.
[8] M. A. Aldajani and A. H. Sayed, "A stable adaptive structure for delta modulation with improved performance," Proc. International Conference on Acoustics, Speech, and Signal Processing, vol. IV, Salt Lake City, Utah, May 2001.
[9] J. Yu, M. Sandler, and R. Hwaken, "Adaptive quantization for one bit delta sigma modulation," IEEE Proceedings G (Circuits, Devices and Systems), vol. 139, no. 1, pp. 39-44, February 1992.
[10] C. Dunn and M. Sandler, "Fixed and adaptive sigma-delta modulator with multibit quantizers," Applied signal processing, vol. 3, no. 4, pp. 212-222, 1996.
[11] M. Ramesh and K. Chao, "Sigma delta analog to digital converters with adaptive quantization," Proceedings of Midwest Symposium on Circuits and Systems, vol. 1.2, pp. 22-25, 1998.
[12] C. Chakravarthy, "An amplitude controlled adaptive delta sigma modulators," Radio and Electronic Engineering, vol. 49, no. 1, pp. 49-54, January 1979.
[13] M. Jaggi and C. Chakravarthy, "Instantaneous adaptive delta sigma modulator," Canadian Electrical Engineering Journal, vol. 11, no. 1, pp. 3-6, January 1986.

6 Conclusion

In conclusion, the present invention discloses adaptive delta and sigma-delta modulation structures using a single quantization bit inside a main loop of a modulator and multiple quantization bits inside an adapter that is used to adapt the step-size of the modulator. Four applications where the adapter is implemented were described, including: (1) a companded differential pulse code modulator, (2) an adaptive sigma-delta modulator, (3) an adaptive delta modulator, (4) an adaptive differential pulse code modulator (ADPCM). The present invention also describes a framework for studying the performance of the proposed adapter structures in terms of first-order random gain models, and show that the proposed adaptive modulation structures result in improved SNR, tracking, and high dynamic range.

This concludes the description including the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching.

It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An apparatus for adaptive modulation, comprising:
    a one-bit modulator, including a quantizer, for generating a binary output signal from an analog input signal using a single quantization bit; and
    a multi-bit adapter for generating a scaling signal for scaling a step-size of the modulator using multiple quantization bits, wherein the step-size is adapted based on an estimate of an absolute value of a signal output from a filter before the signal is input to the quantizer.

2. The apparatus of claim 1, wherein the adapter includes a companded differential pulse code modulator (DPCM).

3. The apparatus of claim 2, wherein the adapter includes a logarithm term block for companding an absolute value of a filtered error signal, the companded DPCM for modulating an output of the logarithm term block, and an exponential term block for expanding an output of the companded DPCM.

4. The apparatus of claim 1, wherein the modulator comprising:
    a summing junction for comparing an analog input signal $x(n)$ to an encoding signal $v(n)$ to generate an error signal $e(n)$ representing a difference between the analog input signal $x(n)$ and the encoding signal $v(n)$;
    the filter for filtering the error signal $e(n)$ to generate a signal $p(n)$;
    the quantizer for converting the signal $p(n)$ into a binary output signal $y(n)$;
    a multiplier for multiplying the binary output signal $y(n)$ by a scaling signal $d(n)$ output by the adapter to generate the encoding signal $v(n)$; and
    a delay for delaying the encoding signal $v(n)$ to generate a delayed encoding signal $v(n-1)$.

5. The apparatus of claim 4, wherein the adapter produces both the scaling signal $d(n)$, which is an approximation of the absolute value of the signal $p(n)$, and a binary sequence signal $q(n)$ from which the scaling signal $d(n)$ can be re-generated.

6. The apparatus of claim 1, wherein the adapter is used in an adaptive sigma-delta modulator.

7. The apparatus of claim 1, wherein the adapter is used in an adaptive delta modulator.

8. The apparatus of claim 1, wherein the adapter is used as a companded delta modulator.

9. An apparatus for adaptive demodulation, comprising:
    a multi-bit adapter for receiving a binary sequence signal $q(n)$ from an adapter of an adaptive modulation apparatus and for generating a scaling signal $d(n)$ in response thereto using multiple quantization bits;
    a multiplier for multiplying a binary output signal $y(n)$ received from a one bit modulator of the adaptive modulation apparatus by the scaling signal $d(n)$ to generate an encoding signal $v(n)$, wherein the binary output signal $y(n)$ is generated by the one-bit modulator from an analog input signal $x(n)$ using a single quantization bit; and
    a low-pass filter for receiving the encoding signal $v(n)$ and for generating a signal $\hat{x}(n)$, which is a re-creation of the analog input signal $x(n)$ to the modulator of the adaptive modulation apparatus;
    wherein the binary sequence signal $q(n)$ is generated by the adapter of the adaptive modulation apparatus based on an estimate of an absolute value of signal output from a filter before the signal is input to a quantizer in the one bit modulator of the adaptive modulation apparatus.

10. The apparatus of claim 9, wherein the adapter includes a companded differential pulse code modulator (DPCM).

11. The apparatus of claim 10, wherein the adapter includes a logarithm term block for companding an absolute value of a filtered error signal, the companded DPCM for modulating an output of the logarithm term block, and an exponential term block for expanding an output of the companded DPCM.

12. The apparatus of claim 9, wherein the adapter is used in an adaptive sigma-delta modulator.

13. The apparatus of claim 9, wherein the adapter is used in an adaptive delta modulator.

14. The apparatus of claim 9, wherein the adapter is used as a companded delta modulator.

* * * * *

UNITED STATES PATENT AND TRADEMARK OFFICE
CERTIFICATE OF CORRECTION

PATENT NO. : 7,391,350 B2
APPLICATION NO. : 10/529712
DATED : June 24, 2008
INVENTOR(S) : Mansour A. Aldajani and Ali H. Sayed It is certified that error appears in the above-identified patent and that said Letters Patent is hereby corrected as shown below:

Title Page

Under Related U.S. Application Data: should read

--(63)  Continuation-in-part of application No. 10/332,750, filed on Jan. 13, 2003, now Pat. No. 7,073,113, "application No. 10/529,712, which is a" continuation-in-part of application No. 10/256,606, filed on Sep. 27, 2002, now Pat. No. 7,415,285.--

Signed and Sealed this

Ninth Day of February, 2010

David J. Kappos
*Director of the United States Patent and Trademark Office*